(12) United States Patent
Ukai et al.

(10) Patent No.: US 9,541,975 B2
(45) Date of Patent: Jan. 10, 2017

(54) SEMICONDUCTOR DEVICE, BATTERY PACK AND PERSONAL DATA ASSISTANT

(71) Applicant: Renesas Electronics Corporation, Kawasaki-shi (JP)

(72) Inventors: Toshitaka Ukai, Kawasaki (JP); Hidekazu Nagato, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 231 days.

(21) Appl. No.: 14/448,939

(22) Filed: Jul. 31, 2014

(65) Prior Publication Data

US 2015/0058654 A1 Feb. 26, 2015

(30) Foreign Application Priority Data

Aug. 22, 2013 (JP) ................................ 2013-172135

(51) Int. Cl.

| G06F 1/26 | (2006.01) |
| G06F 1/32 | (2006.01) |
| G01R 31/36 | (2006.01) |
| H02J 7/00 | (2006.01) |

(52) U.S. Cl.
CPC .............. *G06F 1/26* (2013.01); *G01R 31/3662* (2013.01); *G01R 31/3693* (2013.01); *G01R 31/3624* (2013.01); *G01R 31/3655* (2013.01); *H02J 7/007* (2013.01)

(58) Field of Classification Search
CPC ........ G06F 1/26; G06F 1/263; G01R 31/3606; G01R 31/3624; G01R 31/3662; H02J 7/007

USPC .......................................... 713/300, 320, 340
See application file for complete search history.

(56) References Cited

U.S. PATENT DOCUMENTS

| 2005/0269991 | A1* | 12/2005 | Mitsui et al. ...... | G01R 31/3624 320/132 |
| 2010/0026092 | A1* | 2/2010 | Iida ....................... | H01M 10/44 307/18 |
| 2011/0084702 | A1* | 4/2011 | Mori ................... | G01R 31/3679 324/430 |

FOREIGN PATENT DOCUMENTS

| JP | 2001-051029 A | 2/2001 |
| JP | 2003-079059 A | 3/2003 |
| JP | 2010-034016 A | 2/2010 |

* cited by examiner

*Primary Examiner* — Michael J Brown
(74) *Attorney, Agent, or Firm* — McGinn IP Law Group, PLLC.

(57) ABSTRACT

A semiconductor device includes a voltage measurement unit that measures a voltage of a battery, a current measurement unit that measures charging and discharging currents of the battery, a data processing control unit, and a current detection unit. The voltage measurement unit and the current measurement unit are able to measure the voltage and the discharging current of the battery in case that the current detection unit detects that the discharging current exceeds a predetermined threshold. The data processing control unit estimates an internal resistance of the battery based on a voltage measurement value measured by the voltage measurement unit in accordance with the detection performed by the current detection unit and a current measurement value measured by the current measurement unit in accordance with the detection performed by the current detection unit, and calculates an amount of maximum power capable of being supplied from the battery.

20 Claims, 10 Drawing Sheets

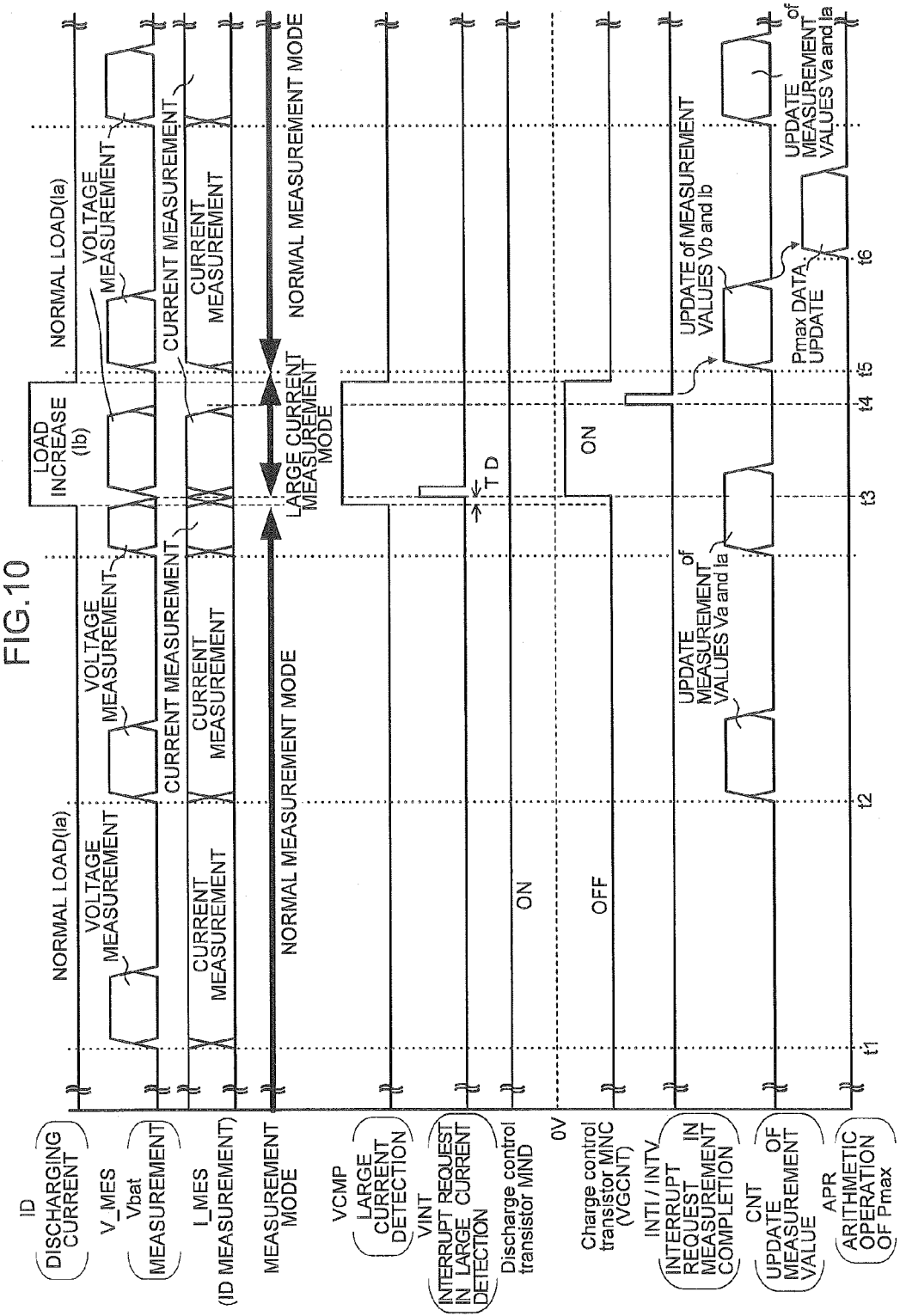

SEMICONDUCTOR DEVICE, BATTERY PACK AND PERSONAL DATA ASSISTANT

CROSS-REFERENCE TO RELATED APPLICATIONS

The present application claims priority from Japanese application JP 2013-172135 filed on Aug. 22, 2013, the content of which is hereby incorporated by reference into this application.

BACKGROUND

The present invention relates to a semiconductor device, a battery pack, and a personal data assistant, and particularly relates to a technique effective in case that applied to a semiconductor device for monitoring the state of a battery.

In recent years, CPUs (including a GPU) mounted on an internal circuit (PC system) in a personal data assistant such as a notebook computer have had a gradual tendency to be provided with a variable frequency function in order to have a balance between power consumption, arithmetic operation performance and reliability (lifetime). The variable frequency function means that during a normal time, power consumption is reduced by setting the clock frequency of the CPU to be relatively low (normal clock operation) and a deterioration in the reliability of the CPU is suppressed by suppressing a temperature rise of the CPU, and that during an increase in a CPU resource request of an application, arithmetic operation performance is improved by setting the clock frequency of the CPU to be high (high-speed clock operation).

In case that an AC adapter is not connected to a notebook computer during a CPU's high-speed clock operation, the entire power required for a CPU's high-speed clock operation is supplied from a battery (assembled battery obtained by combining a plurality of secondary battery cells). On the other hand, in case that an AC adapter is connected to a notebook computer, power required for a high-speed clock operation is supplied from the AC adapter and the battery. This is because a maximum power of the AC adapter is designed to be smaller than a maximum power required during a high-speed clock operation for the purpose of a reduction in weight, a reduction in power consumption, and a reduction in cost. Meanwhile, power drawn from the battery as shortage power of the AC adapter during a high-speed clock operation is supplemented by the battery being charged through the AC adapter during a normal clock operation.

As stated above, in order for the CPU to perform a high-speed clock operation, a supply of power from the battery is required regardless of the presence or absence of the connection of the AC adapter. For this reason, a period in which the CPU performs a high-speed clock operation and a clock frequency during a high-speed clock operation are determined on the basis of the amount of power which is capable of being supplied from the battery. For example, the CPU having a variable frequency function is configured such that a plurality of clock frequencies higher than a clock frequency during a normal clock operation can be selected as a clock frequency during a high-speed clock operation, and an optimum clock frequency is selected in accordance with the amount of power which is capable of being supplied from the battery in that case.

On the other hand, the state of the battery mounted on a personal data assistant such as a notebook computer is monitored by a battery monitoring system mounted on a battery pack together with the battery. Generally, the battery monitoring system is configured to include a battery control IC (FGIC: Fuel Gauge IC), a sense resistor for detecting charging and discharging currents of the battery as voltage information, a charge control MOS transistor, a discharge control MOS transistor, and a protective circuit such as a thermistor or a fuse. The battery control IC is configured to include, for example, a microcontroller, and realizes a function of managing the remaining capacity of a battery, a function of controlling a charge control/discharge control MOS transistor, a function of protecting a battery, and the like. For example, the battery control IC generates information indicating a battery state on the basis of detection results of charging and discharging currents and a battery voltage of a battery, and notifies an internal circuit of a personal data assistant of the information. The information indicating a battery state includes, for example, full charge capacity (FCC), Remaining Capacity (RC) of a battery, state of charge (SOC) of a battery, and the like. A conventional example of the battery control IC is disclosed in, for example, JP-A-2010-34016, JP-A-2003-79059, and JP-A-2001-51029.

In the battery control IC mounted on a battery pack of a notebook computer on which the CPU having the aforementioned variable frequency function is mounted, information of the amount of maximum power which is capable of being supplied from the battery to the internal circuit is generated on the basis of measurement results of a discharging current and a battery voltage of the battery, in addition to the information indicating the battery state mentioned above. The information of the amount of maximum power is notified to a PC system (internal circuit) of a notebook computer at any time (for example, once per second), and is used, as described above, in determining a clock frequency during the high-speed clock operation or a period of the high-speed clock operation.

SUMMARY

A CPU having a variable frequency function requires information of a more accurate amount of maximum power in order to perform a high-speed clock operation in an optimum period at an optimum clock frequency. The amount of maximum power is calculated, for example, on the basis of a maximum current capable of being supplied from a battery in a range in which a power supply voltage applied to a PC system does not fall below a minimum operating voltage for guaranteeing an operation of the PC system, and the above minimum operating voltage.

Generally, in a secondary battery cell, since internal impedance changes depending on a discharging current value, a change in discharging current causes a change in an output voltage of a battery, and the power supply voltage applied to the PC system also changes. For this reason, in order to obtain an accurate amount of maximum power, the discharging current and the battery voltage are measured in case that the CPU of the PC system operates at a high-speed clock in reality, internal impedance is estimated from the measurement results, and thus a maximum current Imax has to be obtained on the basis of a value of the estimated internal impedance.

However, it is not easy to measure the discharging current and the battery voltage during a high-speed clock operation. The reasons therefor include that the period of the high-speed clock operation is approximately 10 ms which is short, regularity is not present in the generation of the high-speed clock operation, and there is no function in which switching from a normal clock operation to the high-speed clock operation is notified from the PC system to the battery pack side (battery control IC). For this reason, in a battery control IC of the related art, it was difficult to discriminate whether the PC system operates in the high-speed clock operation mode, and it was difficult to measure the discharging current and the battery voltage timely in a short period in which the high-speed clock operation is performed. In order to solve such a problem, a method is also considered in which a function of performing the high-speed clock operation only for a predetermined period is given to the PC system side. However, since such a function increases power consumption unnecessarily, and a change in the specification of the PC system side is required, the above method is not appropriate. Meanwhile, in the configurations disclosed in JP-A-2010-34016, JP-A-2003-79059, and JP-A-2001-51029, the well-timed measurement of a large current for a short time generated unexpectedly and a battery voltage is not considered at all.

Although means and the like for solving such problems will be described below, other problems and novel features will be made clearer from the description and the accompanying drawings of the present specification.

The following is a brief description of the summary of the representative embodiments of the invention disclosed in the application.

That is, the semiconductor device includes a voltage measurement unit that measures a voltage of the battery, a current measurement unit that measures a charging current and a discharging current of the battery, a data processing control unit that generates state information indicating a state of a battery, on the basis of measurement results of the voltage measurement unit and the current measurement unit, and a current detection unit. The voltage measurement unit and the current measurement unit are able to measure the voltage and the discharging current in case that the current detection unit detects that the discharging current exceeds the predetermined threshold. The data processing control unit estimates an internal resistance of the battery on the basis of a voltage measurement value measured by the voltage measurement unit in accordance with the detection performed by the current detection unit and a current measurement value measured by the current measurement unit in accordance with the detection performed by the current detection unit, and calculates an amount of maximum power which is capable of being supplied from the battery on the basis of the estimated value.

The following is a brief description of an effect obtained by the representative embodiments of the invention disclosed in the application.

That is, according to the semiconductor device, it is possible to calculate the amount of maximum power which is capable of being supplied from the battery with a high level of accuracy during the high-speed clock operation of the CPU.

BRIEF DESCRIPTION OF THE DRAWINGS

FIG. 10 is a timing chart illustrating an operation example of the battery control IC according to the second embodiment.

DETAILED DESCRIPTION

1. Summary of the Embodiments

Figure 1:
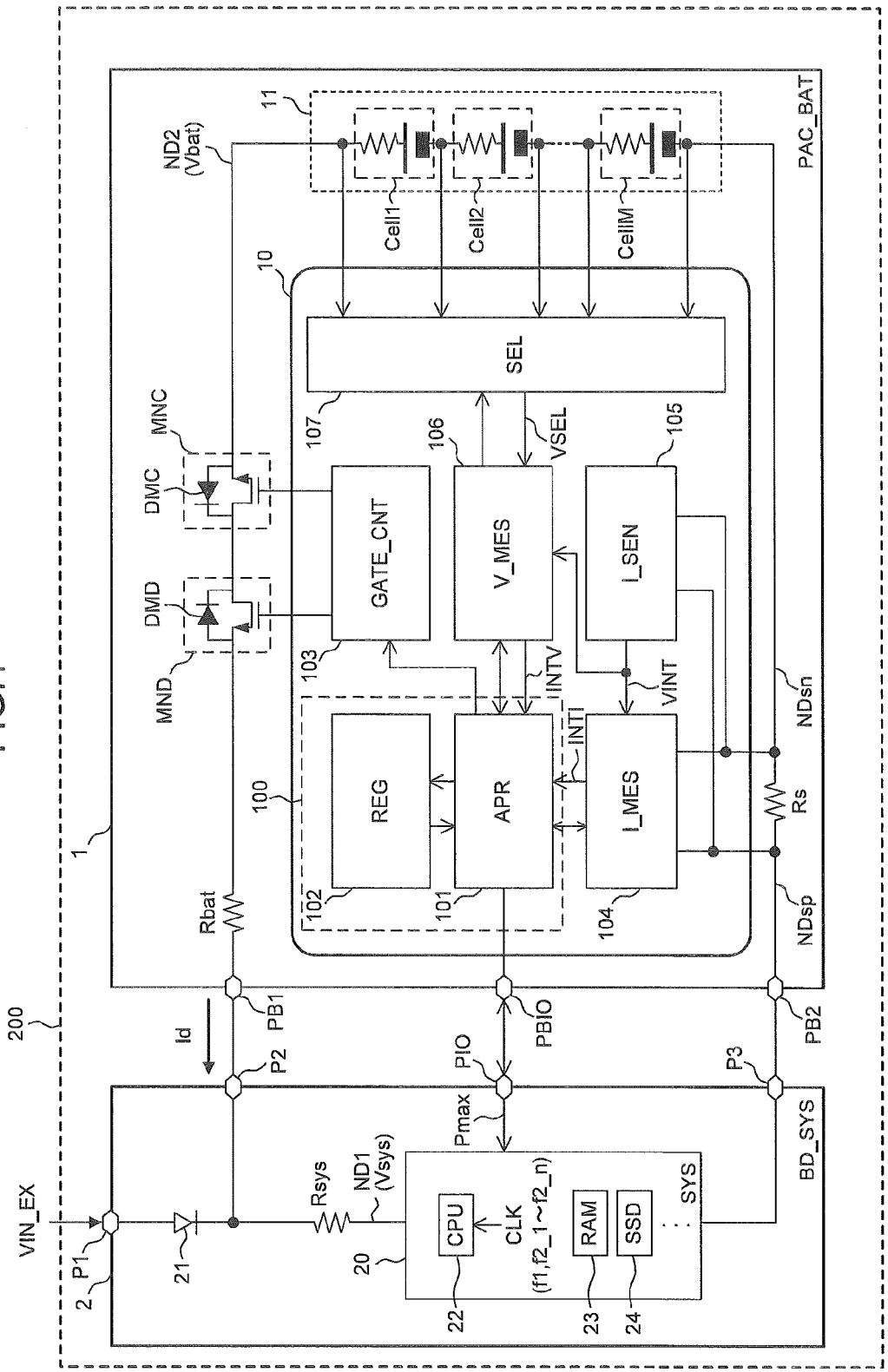
FIG. 1 is a diagram illustrating a personal data assistant on which a battery pack including a battery control IC according to a first embodiment is mounted.

First, summary of representative embodiments of the present invention disclosed in the application will be described. Reference numerals in drawings in parentheses referred to in description of the summary of the representative embodiments just denote components included in the concept of the components to which the reference numerals are designated.

[1] (FGIC that Detects Significant Increase in Discharging Current Using Current Detection Unit Different from Current Measurement Unit, and Measures Battery Voltage and Discharging Current in State where Discharging Current Increases)

A semiconductor device (10, 30) for monitoring a state of a battery (11) according to a representative embodiment of the application has the following configuration. The semiconductor device includes a voltage measurement unit (106) that measures a voltage of the battery, a current measurement unit (105) that measures a charging current and a discharging current of the battery, and a data processing control unit (100) that generates state information indicating the state of the battery on the basis of measurement results (Ia, Ib, Va, Vb) of the voltage measurement unit and the current measurement unit. The semiconductor device further includes a current detection unit (105, 305) that detects that the discharging current exceeds a predetermined threshold. The voltage measurement unit and the current measurement unit are able to measure the voltage and the discharging current in case that the current detection unit detects that the discharging current exceeds the predetermined threshold. The data processing control unit estimates an internal resistance (R) of the battery on the basis of a voltage measurement value (Vb) measured by the voltage measurement unit in accordance with the detection performed by the current detection unit and a current measurement value (Ib) measured by the current measurement unit in accordance with the detection performed by the current detection unit, and calculates an amount of maximum power (Pmax) which is capable of being supplied from the battery on the basis of the estimated value.

According to this, it is possible to easily measure the battery voltage and the discharging current in case that a large current is generated as the discharging current of the battery, and to estimate the internal resistance of the battery with a high degree of accuracy during the generation of the large current. Thereby, the calculation accuracy of the amount of maximum power which is capable of being supplied from the battery is improved.

[2] (Measure Discharging Current by Decreasing Resolution of A/D Converter During Increase in Discharging Current)

In the semiconductor device according to paragraph 1, the current measurement unit includes a delta sigma-type A/D conversion circuit (1041). A resolution of the A/D conversion circuit becomes lower in accordance with the detection performed by the current detection unit.

According to this, it is possible to complete the measurement of the discharging current in a period in which a large current is generated. In addition, since it is not necessary to separately provide the A/D conversion circuit for measuring the discharging current during the generation of the large current, it is possible to suppress an increase in the scale of the circuit of the semiconductor device.

[3] (Turn on of Charge Control Transistor During Increase in Discharge Current)

The semiconductor device (30) according to paragraph 1 or 2 further includes a control unit (303) that controls a charge control transistor (MNC) and a discharge control transistor (MND) which are connected in series to a supply path of power between the battery and an external device (20). The control unit enables the battery to be charged by turning on the charge control transistor. In addition, the control unit enables the battery to be discharged by turning on the discharge control transistor. Further, the control unit turns on the charge control transistor in a state where the discharge control transistor is turned on in case that the current detection unit detects that the discharging current exceeds the predetermined threshold during discharge of the battery.

According to this, in case that a large current is generated during discharge, a forward voltage drop of one stage of a body diode of the transistor does not occur in the power supply path between the battery and the external device, and thus it is possible to increase the amount of power supplied during discharge. According to this, since a voltage drop due to a parasitic resistance component of the body diode of the transistor in the power supply path is reduced, the maximum current which is capable of being output from the battery becomes larger, and thus it is possible to further increase the amount of maximum power.

[4] (Configuration of Current Detection Unit: Comparator Circuit that Compares Voltage Between Sense Resistors with Reference Voltage)

In the semiconductor device (10, 30) according to any one of paragraphs 1 to 3, the current detection unit includes a comparator circuit (1052) that compares a detection voltage (Vs) based on the discharging current with a reference voltage (Vth) based on the predetermined threshold (Ith).

According to this, it is possible to easily determine whether the discharging current exceeds the predetermined threshold.

[5] (Configuration of Current Detection Unit: Signal Generation Circuit that Generates Interrupt Signal in Accordance with Comparison Result of Comparator Circuit)

In the semiconductor device according to paragraph 4, the current detection unit further includes a signal generation circuit (1053, 3053) that outputs an interrupt signal (VINT) for instructing measurement execution in case that a state where the detection voltage exceeds the reference voltage continues for a predetermined period (TD). The voltage measurement unit and the current measurement unit start measurement in accordance with the interrupt signal.

According to this, it is possible to prevent an increase in instantaneous current caused by noise or the like from being erroneously detected.

[6] (Configuration of Current Detection Unit: Level Shifter+Gain Adjustment Circuit Provided at Preceding Stage of Comparator Circuit)

In the semiconductor device according to paragraph 5, the current detection unit further includes an amplification unit (1051, 1054) that amplifies a signal level of the detection voltage and supplies the amplified signal level to the comparator circuit.

According to this, it is possible to further reduce the resistance value of the sense resistor, connected in series to the power supply path between the battery and the external device, for generating the detection voltage of the discharging current.

[7] (Battery Pack)

A battery pack (1, 3) according to an representative embodiment of the application includes an assembled battery (11) which is constituted by a plurality of secondary battery cells (Cell1 to CellM), a first terminal (PB1) and a second terminal (PB2) for connecting the assembled battery to an external device, and a charge control transistor (MNC) and a discharge control transistor (MND) which are connected in series to a power supply path between the first terminal and the assembled battery. The battery pack further includes a sense resistor (Rs) which is connected in series to a power supply path between the second terminal and the assembled battery, and a battery control IC (10, 30) that monitors a state of the assembled battery and controls turn-on and turn-off of the charge control transistor and the discharge control transistor. The battery control IC includes a voltage measurement unit (106) that measures an output voltage (Vbat) of the assembled battery, and a current measurement unit (104) that measures a discharging current and a charging current (Id) of the assembled battery on the basis of a voltage (Vs) between both ends of the sense resistor. The battery control IC further includes a data processing control unit (100) that generates state information indicating a state of a battery, on the basis of measurement results of the voltage measurement unit and the current measurement unit, a current detection unit (105, 305) that detects that a voltage between both ends of the sense resistor exceeds a predetermined threshold voltage (Vth), and a control unit (103, 303) that controls the charge control transistor and the discharge control transistor. The voltage measurement unit and the current measurement unit are able to measure the output voltage and the discharging current in case that the current detection unit detects that the discharging current exceeds the predetermined threshold. The data processing control unit estimates an internal resistance of the battery on the basis of a voltage measurement value (V2) measured by the voltage measurement unit in accordance with the detection performed by the current detection unit and a current measurement value (I2) measured by the current measurement unit in accordance with the detection performed by the current detection unit, and calculates an amount of maximum power (Pmax) which is capable of being supplied from the assembled battery on the basis of the estimated value.

According to this, it is possible to provide the battery pack having high calculation accuracy of the amount of maximum power which is capable of being supplied from the battery.

[8] (Battery Pack: Measure Discharging Current by Decreasing Resolution of A/D Converter During Increase in Discharging Current)

In the battery pack according to paragraph 7, the current measurement unit includes a delta sigma-type A/D conversion circuit (1041). A resolution of the A/D conversion circuit becomes lower in accordance with the detection performed by the current detection unit.

According to this, it is possible to complete the measurement of the discharging current in a period in which a large current is generated. In addition, since it is not necessary to separately provide the A/D conversion circuit for measuring the discharging current during the generation of the large current, it is possible to suppress an increase in the scale of the circuit of the battery control IC, and to suppress an increase in the cost of the battery pack.

[9] (Battery Pack: Turn on Charge Control Transistor During Increase in Discharging Current)

In the battery pack according to paragraph 7 or 8, the control unit enables the battery to be charged by turning on the charge control transistor and turning off the discharge control transistor, and enables the battery to be discharged by turning off the charge control transistor and turning on the discharge control transistor. Further, the control unit turns on the charge control transistor in a state where the discharge control transistor is turned on in case that the current detection unit detects that the discharging current exceeds the predetermined threshold during discharge of the battery.

According to this, it is possible to provide the battery pack which has a small power loss at the time of generating a large current during discharge and which is capable of obtaining the larger amount of maximum power.

[10] (Personal Data Assistant to which Battery Pack is Mounted)

A personal data assistant (200, 201) according to an representative embodiment of the application includes the battery pack according to any one of paragraphs 7 to 9, and an internal circuit (20), including a CPU (22), which is able to be operated by a supply of power from the assembled battery. The internal circuit is configured such that a normal clock operation mode in which the CPU operates at a first clock frequency (f1) and a high-speed clock operation mode in which the CPU operates at a second clock frequency (f2, f2_1 to f2_n) higher than the first clock frequency are capable of being switched between. The internal circuit determines a magnitude of the second clock frequency on the basis of the amount of maximum power calculated by the semiconductor device in case that the CPU operates in the high-speed clock operation mode.

According to this, the internal circuit determines the frequency of a clock signal in the high-speed clock operation mode on the basis of the amount of maximum power calculated by the battery control IC with a high degree of accuracy, and thus it is possible to further improve the arithmetic operation performance of the CPU.

[11] (FGIC that Measures Battery Voltage and Discharging Current in Second Measurement Mode in Case that Large Current is Detected During Measurement in First Measurement Mode)

A semiconductor device (10, 30) for monitoring a state of a battery (11) according to a representative embodiment of the application has the following configuration. The semiconductor device includes a voltage measurement unit (106) that measures an output voltage (Vbat) of the battery and a current measurement unit (104) that measures a charging current and a discharging current (Id) of the battery. The semiconductor device further includes a data processing control unit (101) that generates state information indicating a state of a battery, on the basis of measurement results of the voltage measurement unit and the current measurement unit, and a current detection unit (105 and 305) that detects that the discharging current exceeds a predetermined threshold (Ith). The voltage measurement unit and the current measurement unit have a first measurement mode (normal measurement mode) and a second measurement mode (large current measurement mode). The voltage measurement unit measures the output voltage in the second measurement mode in case that the current detection unit detects that the discharging current exceeds the predetermined threshold at the time of measuring the output voltage in the first measurement mode. The current measurement unit measures the discharging current in the second measurement mode in case that the current detection unit detects that the discharging current exceeds the predetermined threshold at the time of measuring the discharging current in the first measurement mode. The data processing control unit estimates an internal resistance of the battery on the basis of a first voltage measurement value (Va) and a first current measurement value (Ia) which are measured by the voltage measurement unit and the current measurement unit in the first measurement mode and a second voltage measurement value (Vb) and a second current measurement value (Ib) which are measured by the voltage measurement unit and the current measurement unit in the second measurement mode, and calculates an amount of maximum power (Pmax) which is capable of being supplied from the battery on the basis of the estimated value.

According to this, it is possible to easily measure the battery voltage and the discharging current in case that a large current is generated as the discharging current of the battery, and to estimate the internal resistance of the battery with a high degree of accuracy during the generation of the large current. Thereby, the calculation accuracy of the amount of maximum power which is capable of being supplied from the battery is improved.

[12] (Measure Discharge Current by Decreasing Resolution of A/D Converter During Increase in Discharge Current)

In the semiconductor device according to paragraph 11, the current measurement unit includes a delta sigma-type A/D conversion circuit (1041) The A/D conversion circuit is configured such that a resolution of A/D conversion in the second measurement mode becomes lower than a resolution of A/D conversion in the first measurement mode.

According to this, it is possible to complete the measurement of the discharging current in a period in which a large current is generated. In addition, since it is not necessary to separately provide the A/D conversion circuit for measuring the discharging current during the generation of the large current, it is possible to suppress an increase in the scale of the circuit of the semiconductor device.

[13] (Turn on Charge Control Transistor During Increase in Discharging Current)

The semiconductor device (30) according to paragraph 10 or 12 further includes a control unit (303) that controls a charge control transistor (MNC) and a discharge control transistor (MND) which are connected in series to a supply path of power between the battery and an external device. The control unit enables the battery to be charged by turning on the charge control transistor, and enables the battery to be discharged by turning on the discharge control transistor. Further, the control unit turns on the charge control transistor in a state where the discharge control transistor is turned on in case that the current detection unit detects that the discharging current exceeds the predetermined threshold during discharge of the battery.

According to this, in case that a large current is generated during discharge, a forward voltage drop of one stage of a body diode of the transistor does not occur in the power supply path between the battery and the external device, and thus it is possible to increase the amount of power supplied during discharge. According to this, since a voltage drop due to a parasitic resistance component of the body diode of the transistor in the power supply path is reduced, the maximum current which is capable of being output from the battery becomes larger, and thus it is possible to further increase the amount of maximum power.

2. Further Detailed Description of the Embodiments

A further detailed description of the embodiments will be given. Meanwhile, in all the drawings for the purpose of describing a mode for carrying out the invention, components having the same functions are denoted by the same reference numerals and signs, and thus the description thereof will not be repeated.

First Embodiment

FIG. 1 is a diagram illustrating a personal data assistant on which a battery pack including a battery control IC according to a first embodiment is mounted.

A personal data assistant 200 shown in this drawing is, for example, a notebook computer, and is configured to include a system board (BD_SYS) 2 and a battery pack (PAC_BAT) 1.

The system board 2 is configured such that an internal circuit (SYS) 20 and a plurality of external terminals for realizing a function as a notebook computer are formed on a mounting substrate such as a printed-circuit substrate. In this drawing, an external power supply terminal 21 for receiving the supply of an external power supply VIN_EX, a high-potential-side power supply terminal P2 and a low-potential-side power supply terminal P3 for connection to the battery pack 1, and an input and output terminal PIO for communicating with the battery pack 1 are typically illustrated as the plurality of external terminals.

The internal circuit 20 can be operated by power which is supplied from the battery pack 1 through the high-potential-side power supply terminal P2 and the low-potential-side power supply terminal P3. A parasitic resistance component such as a wiring resistor or a contact resistor of the external terminal is present in a power supply path from the high-potential-side power supply terminal P2 to the internal circuit 20, and this resistance component is denoted by reference numeral Rsys in this drawing. In addition, in case that the external power supply (for example, AC adapter) VIN_EX is connected to the external power supply terminal P1, the internal circuit 20 can also be operated by external power supplied from the external power supply VIN_EX through a diode 21. Meanwhile, the external power supplied from the external power supply VIN_EX is supplied to the internal circuit 20 as described above and supplied to the battery pack 1 as necessary, and is used in charging an assembled battery 11.

The internal circuit 20 is configured to include a plurality of semiconductor parts such as, for example, a CPU (including a GPU) 22, a large-capacity RAM (RandomAccess Memory) 23, and an SSD (Flash Solid State Drive) 24.

The CPU 22 has a variable frequency function described above. That is, the CPU 22 is configured such that a normal clock operation mode operating at a clock frequency f1 and a high-speed clock operation mode operating at a clock frequency f2 higher than the clock frequency f1 are capable of being switched between. For example, the internal circuit 20 is set to be in a normal clock operation mode during a normal time, and reduces power consumption by bringing the CPU 22 into operation at the relatively low clock frequency f1 and suppresses a deterioration in the reliability of the CPU 22 by suppressing a temperature rise of the CPU 22. On the other hand, in case that a CPU resource request of an application increases, the internal circuit 20 is set to be in a high-speed clock operation mode, and improves arithmetic operation performance by bringing the CPU 22 into operation at the clock frequency f2 higher than the clock frequency f1 during the normal clock operation mode. However, in case that the clock frequency of the CPU 22 is made higher, there is a concern that reliability may deteriorate due to a rise in the chip temperature of the CPU 22. Therefore, a period in which the CPU 22 operates in the high-speed clock operation mode is set to a maximum of, for example, approximately 10 ms which is short. Meanwhile, in case that the CPU 22 is attempted to be continuously brought into operation in the high-speed clock operation mode, control is performed in which the operation mode once returns to the normal clock operation mode after an elapse of the operation period of 10 ms in the high-speed clock operation mode, it is confirmed, thereafter, that the chip temperature of the CPU lowers to a safe range, and then the operation mode is shifted to the high-speed clock operation again.

The period in which the CPU 22 operates in the high-speed clock operation mode and the clock frequency f2 during the high-speed clock operation mode are determined on the basis of the amount of maximum power Pmax which is capable of being supplied from the assembled battery 11 to the internal circuit 20. For example, the CPU 22 is configured such that a plurality of clock frequencies $f2\_1$ to $f2\_n$ (n is an integer equal to or greater than 2) higher than the clock frequency f1 during the normal clock operation mode can be selected as the clock frequency f2 during the high-speed clock operation mode. During a shift to the high-speed clock operation mode, an optimum clock frequency is selected from the clock frequencies $f2\_1$ to $f2\_n$ on the basis of the amount of maximum power Pmax notified from the battery pack 1, and a clock signal CLK of the selected clock frequency is supplied to the CPU 22. For example, a higher clock frequency is selected in case that the amount of maximum power Pmax is large, and a low clock frequency is selected in case that the amount of maximum power Pmax is small. Meanwhile, a detailed description of the amount of maximum power Pmax will be given later.

The battery pack 1 is configured to include the assembled battery 11, a battery control IC 10, a charge control transistor MNC, a discharge control transistor MND, a sense resistor Rs, and a plurality of external terminals. In this drawing, a high-potential-side power supply terminal PB1 and a low-potential-side power supply terminal PB2 of the assembled battery 11, and an input and output terminal PBIO for communicating with the system board 2 are typically illustrated as the external terminals in the battery pack 1.

The high-potential-side power supply terminal PB1 and the low-potential-side power supply terminal PB2 are terminals for electrically connecting the assembled battery 11 to an external device (internal circuit 20 on the system board 2). The high-potential-side power supply terminal PB1 is connected to the high-potential-side power supply terminal P2 on the system board 2, and the low-potential-side power supply terminal PB2 is connected to the low-potential-side power supply terminal P3 on the system board 2.

The assembled battery 11 is provided between the high-potential-side power supply terminal PB1 and the low-potential-side power supply terminal PB2, and is configured such that a plurality of single battery cells Cell1 to Cellm (m is an integer equal to or greater than 2) which are, for example, capable of being charged and discharged are connected in series to each other. Although not particularly limited, the single battery cells Cell1 to Cellm are lithium-ion secondary batteries. The voltage of the assembled battery 11 can be made higher by increasing the number of single battery cells which are connected in series to each other. In addition, a plurality of single battery cell groups connected in series to each other are connected in parallel to each other, thereby allowing the capacity of the assembled battery 11 to be increased. Meanwhile, a case where a plurality of single battery cells constitute the assembled battery 11 is illustrated in this drawing, but the assembled battery may be configured such that only one single battery cell is used in case that the power consumption of the system board 2 is small.

Meanwhile, a node to which a positive electrode of the assembled battery 11 is connected is denoted by reference numeral ND2, and an output voltage of the assembled battery 11 which is supplied to the node ND2 is denoted by reference numeral Vbat.

The turn-on and turn-off of the charge control transistor MNC and the discharge control transistor MND are controlled in accordance with a control signal which is output from the battery control IC 10. The charge control transistor MNC and the discharge control transistor MND are transistors capable of a large current output, and are, for example, IGBT or power MOS transistors, and the like. As an example, this drawing illustrates a case where the charge control transistor MNC and the discharge control transistor MND are constituted by an N-channel-type power MOS transistor. The charge control transistor MNC and the discharge control transistor MND are connected in series to each other between the high-potential-side power supply terminal PB1 and the node ND2 so that the respective drain electrodes thereof (cathode sides of a body diode) face each other. The charge control transistor MNC and the discharge control transistor MND enable electrical connection and disconnection between the assembled battery 11 and an external device (system board 2). For example, the assembled battery 11 can be charged by turning on the charge control transistor MNC. In this case, the discharge control transistor MND may be turned on, and may be turned off. In case that the discharge control transistor MND is turned off, a charging current is supplied from the external power supply VIN_EX through the diode 21 in the system board 2, a body diode DMD of the discharge control transistor MND, and the charge control transistor MNC to the assembled battery 11. In addition, the assembled battery 11 can be discharged by turning on the discharge control transistor MND. In this case, the charge control transistor MNC may be turned on, and may be turned off. In case that the charge control transistor MNC is turned off, a discharging current Id is supplied from the assembled battery 11 through a body diode DMC of the charge control transistor MNC and the discharge control transistor MND to the internal circuit 20. Meanwhile, in this drawing, a parasitic resistance component due to a wiring resistor, a contact resistor of an external terminal, or the like which is present in a power supply path between the high-potential-side power supply terminal PB1 and the node ND2 in the battery pack 1 is shown by a resistor Rbat.

The sense resistor Rs detects currents (charging current and discharging current) flowing into and out of the assembled battery 11 as a voltage. For example, the sense resistor Rs is disposed between a node NDsn to which the negative electrode of the assembled battery 11 is connected and a node NDsp to which the low-potential-side power supply terminal PB2 is connected. The voltage between both ends of the sense resistor Rs is detected as information of the charging current or the discharging current, and is input to the battery control IC 10.

The battery control IC 10 monitors the state of the assembled battery 11, and controls the execution and stop of the charge and discharge of the assembled battery 11. Although not particularly limited, the battery control IC 10 is a one-chip microcontroller formed in a semiconductor substrate such as one single-crystal silicon by a manufacturing technique of a publicly known CMOS integrated circuit. Specifically, the battery control IC 10 has a function of detecting that the CPU 22 in the internal circuit 20 switches to the high-speed clock operation mode by monitoring the discharging current of the assembled battery 11. Further, the battery control IC 10 has a function of measuring the output voltage Vbat and the discharging current Id of the assembled battery 11 during the high-speed clock operation mode, estimating the internal resistance of the assembled battery 11 on the basis of the measurement values, and calculating the amount of maximum power Pmax on the basis of the estimated value. Hereinafter, the configuration of the battery control IC 10 will be described in detail.

The battery control IC 10 is configured to include a data processing control unit 100, a gate control unit (GATE_CNT) 103, a selection unit (SEL) 107, a voltage measurement unit (V_MES) 106, a current measurement unit (I_MES) 104, and a current detection unit (I_SEN) 105.

The selection unit 107 selects a voltage measurement target in accordance with an instruction from the data processing control unit 100. For example, the selection unit 107 inputs output voltages of the respective single battery cells Cell1 to CellM, and selects and outputs any one of the voltages. The voltage measurement unit 106 measures a voltage VSEL selected by the selection unit 107. The voltage measurement unit 106 is configured to include, for example, an A/D converter 1061. The A/D converter 1061 converts the voltage VSEL selected in the selection unit 121 into a digital value with a predetermined conversion cycle (for example, every 8 ms), to thereby realize voltage measurement. The A/D converter 1061 is, for example, a $\Delta\Sigma$-type A/D conversion circuit. The voltage measurement unit 106 further calculates the output voltage Vbat of the assembled battery 11 on the basis of the measurement value of the output voltage of each of the single battery cells Cell1 to CellM. For example, the output voltage Vbat of the assembled battery 11 is calculated by adding the measurement values of the output voltages of all the single battery cells Cell1 to CellM which are connected in series to each other. Results of measurement performed by the voltage measurement unit 106 are stored in a predetermined register within a register unit 102. Meanwhile, the storage of data in the register unit 102 may be performed through direct access by the voltage measurement unit 106, and may be performed through an arithmetic operation unit 101.

The current measurement unit 104 measures the charging and discharging currents of the assembled battery 11. The current measurement unit 104 is configured to include, for example, an A/D converter 1041, and the A/D converter 1041 converts a voltage between both ends of the sense resistor Rs into a digital value with a predetermined conversion cycle to thereby realize current measurement. The current measurement unit 104 further includes a coulomb counter. The coulomb counter integrates the measurement values of the charging current and the discharging current, and thus information of the amount of charge and discharge is generated. The A/D converter 1041 is constituted by, for example, a $\Delta\Sigma$-type A/D conversion circuit, and its resolution can be changed. Although the detailed description thereof will be given later, the A/D converter 1041 of the current measurement unit 104 is controlled so that its resolution decreases in accordance with an interrupt signal VINT from the current detection unit 105. Results of measurement performed by the current measurement unit 104 are stored in a predetermined register within the register unit 102. Meanwhile, the storage of data in the register unit 102 may be performed through direct access by the current measurement unit 104, and may be performed through the arithmetic operation unit 101.

The gate control unit 103 generates a control signal for controlling the turn-on and turn-off of the charge control transistor MNC and the discharge control transistor MND, in accordance with an instruction from the data processing control unit 100. Meanwhile, as shown in FIG. 1, the gate control unit 103 may be configured to directly drive the charge control transistor MNC and the discharge control transistor MND. A pre-driver circuit is provided outside the battery control IC 10, and the pre-driver circuit may be configured to drive the charge control transistor MNC and the discharge control transistor MND on the basis of the control signal which is output from the gate control unit 103.

The data processing control unit 100 performs comprehensive control of each functional unit in the battery control IC 10, and performs various types of arithmetic operations. In addition, the data processing control unit 100 transmits and receives data to and from the internal circuit 20 in the system board 2 through an external interface circuit which is not shown in the drawing. Specifically, the data processing control unit 100 is realized by a program processing device which is configured to include a CPU that executes an arithmetic operation and control in accordance with a program, a non-volatile storage unit (such as a mask ROM or a flash memory) in which the program is stored, a volatile storage unit (RAM) for storing arithmetic operation results, and the like.

As the data processing control unit 100, the arithmetic operation unit (APR) 101 as function realization means for realizing an arithmetic operation function or a control function of the data processing control unit 100, and the register unit (REG) 102 constituted by various types of registers used in an arithmetic operation and control performed by the data processing control unit 100 are typically shown in FIG. 1. Various types of parameters such as the resistance value of the sense resistor Rs, the resistance values of the parasitic resistors Rsys and Rbat, the on-resistances of the charge control/discharge control transistors MNC and MND, the forward voltages of the body diodes DMC and DMD, and a minimum guarantee voltage Vmin are stored in the register unit 102. In addition, the results of measurement performed by the voltage measurement unit 106 and the current measurement unit 104, as described above, are also stored in the register unit 102.

The arithmetic operation unit 101 performs various types of arithmetic operations on the basis of the charging current value and the discharging current value which are measured by the current measurement unit 104, and the voltages of the single battery cells Cell1 to CellM which are measured by the voltage measurement unit 106, to thereby generate the information of the state of the assembled battery 11. The generated information is transmitted to the internal circuit 20 within the system board 2 through the input and output terminal PBIO. Specifically, the arithmetic operation unit 101 generates full charge capacity (FCC), remaining capacity (RC) of the battery, state of charge (SOC) of the battery, and the like as state information of the battery, and generates information of the amount of maximum power Pmax. A timing at which the amount of maximum power Pmax is transmitted to the internal circuit 20 is determined by a request from the internal circuit 20, and the information of the amount of maximum power Pmax is transmitted, for example, every second. Meanwhile, a specific calculation method of the amount of maximum power Pmax will be described later.

The current detection unit 105 determines whether the discharging current Id exceeds a predetermined threshold current Ith.

Figure 2:
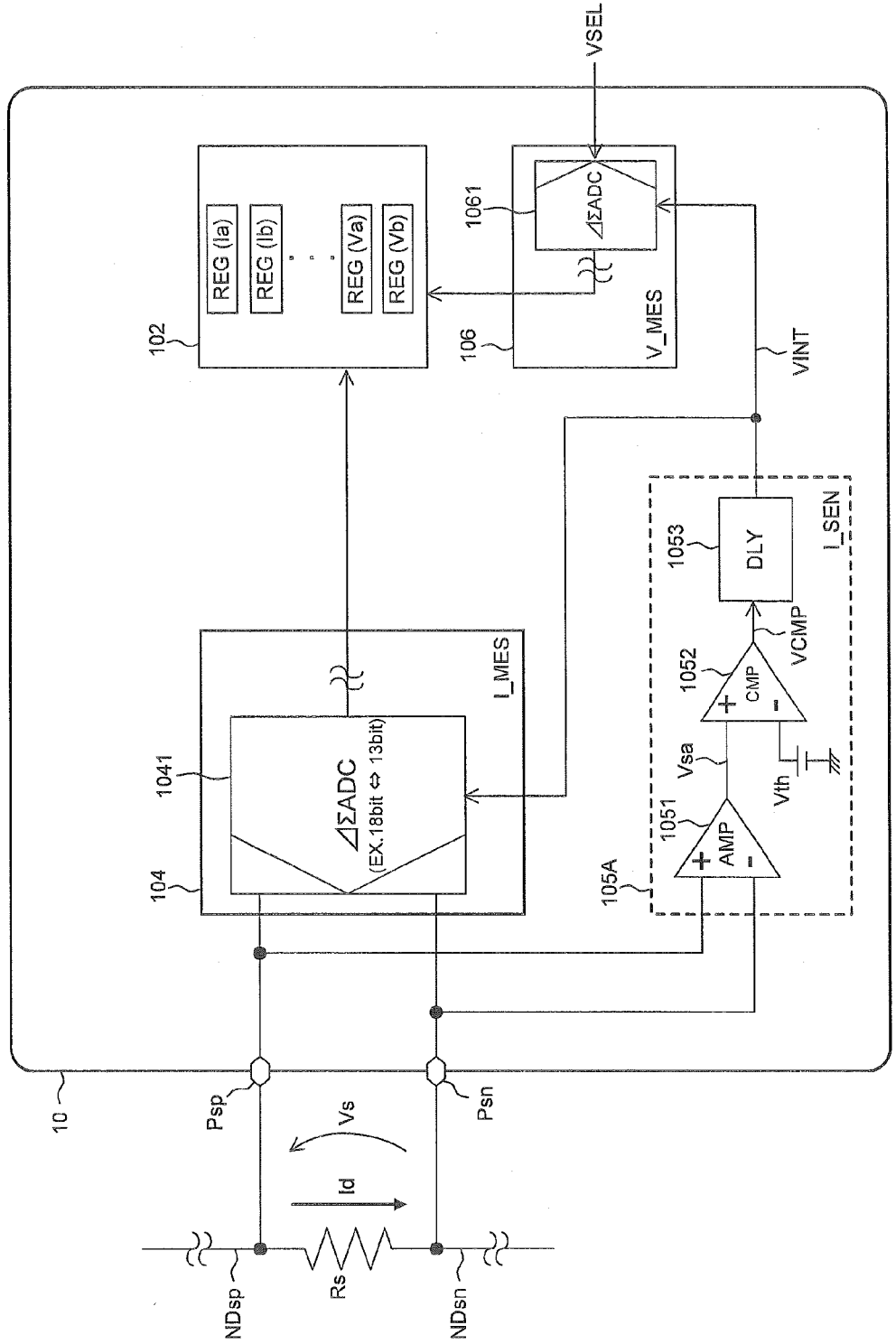
FIG. 2 is a diagram illustrating an internal configuration example of a current detection unit.

FIG. 2 shows an internal configuration example of the current detection unit 105. A current detection unit 105A shown in this drawing is configured to include a differential amplifier (AMP) 1051, a comparator circuit (CMP) 1052, and an output signal generation unit (DLY) 1053. The differential amplifier 1051 amplifies and outputs a detection voltage (voltage between both ends of sense resistor Rs) Vs which is input through external terminals Psp and Psn of the battery control IC 10. For example, in case that the amplification factor of the differential amplifier 1051 is set to be 100 times more, the detection voltage Vs of 1 mV generated by the discharging current Id of 500 mA flowing through the sense resistor Rs of 2 m$\Omega$ is amplified to 100 mV and the amplified voltage is output. The comparator circuit 1052 compares a voltage Vsa amplified by the differential amplifier 1051 with a threshold voltage Vth based on the threshold current Ith, and outputs a comparison result VCMP. For example, the signal level of the comparison result VCMP is set to a low level in case that the voltage Vsa is lower than the threshold voltage Vth, and the signal level of the comparison result VCMP is set to a high level in case that the voltage Vsa is higher than the threshold voltage Vth. The threshold current Ith is a reference value for discriminating whether the CPU 22 of the internal circuit 20 operates in the high-speed clock Operation mode, or operates in the normal clock operation mode. For example, the threshold current Ith is set to be a value larger than an expected value of the discharging current in case that the CPU 22 operates in the normal clock operation mode, and is set to be a value smaller than the expected value of the discharging current in case that the CPU 22 operates in the high-speed clock operation mode. The threshold voltage Vth is a reference voltage which is set in accordance with the threshold current Ith. The output signal generation unit 1053 generates the interrupt signal VINT in case that it is detected by the comparator circuit 1052 that the discharging current Id exceeds the threshold current Ith. For example, the output signal generation unit 1053 generates the interrupt signal VINT in case that a state in which the discharging current Id exceeds the threshold current Ith continues for a predetermined period TD or more.

Figure 3:
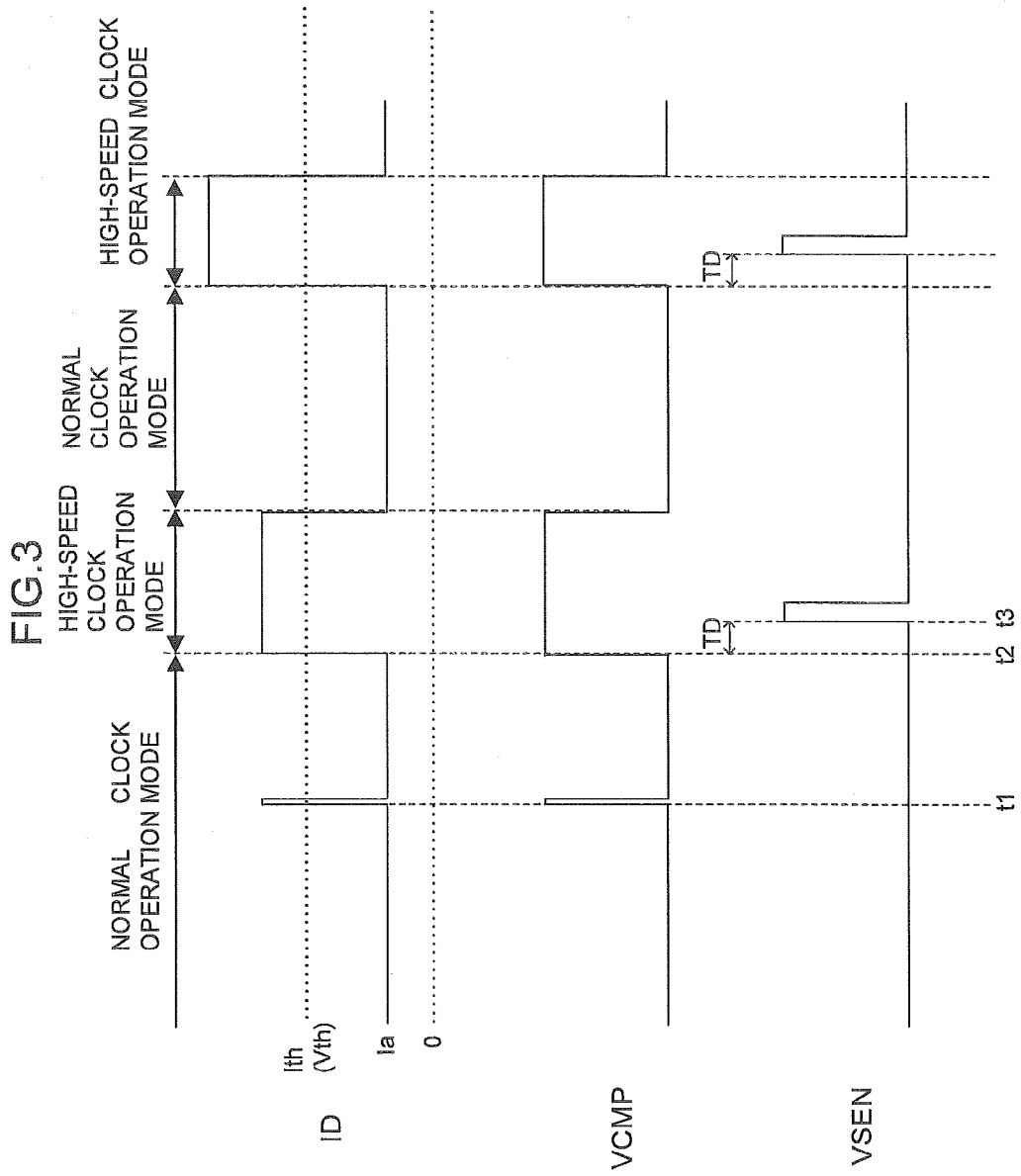
FIG. 3 is a timing chart illustrating an operation example of the current detection unit.

FIG. 3 is a timing chart illustrating an operation example of the current detection unit. As shown in this drawing, in case that the CPU 22 operates in the normal clock operation mode, it is assumed that the discharging current Ia flows. In case that the discharging current exceeds the threshold current Ith instantaneously at time t1 due to the influence of noise or the like, the comparison result VCMP of the comparator circuit 1052 is reversed (for example, the signal level is changed from a low level to a high level). In this case, since a period in which the comparison result VCMP is set to be at a high level is less than the predetermined period TD, the output signal generation unit 1053 does not generate the interrupt signal VINT. Thereafter, in case that the CPU 22 switches from the normal clock operation mode to the high-speed clock operation mode at time t2, and that the discharging current exceeds the threshold current Ith, the comparison result VCMP of the comparator circuit 1052 is set to be at a high level again. At time t3 after an elapse of the predetermined period TD in a state where the comparison result VCMP is set to be at a high level, the output signal generation unit 1053 generates the interrupt signal VINT. Although not particularly limited, the interrupt signal VINT becomes a signal having a one-shot pulse shape.

The current detection unit 105 is configured as in FIG. 3, and thus the comparator circuit 1052 can easily determine whether the discharging current Id exceeds the threshold current Ith. In addition, the interrupt signal VINT is generated by the output signal generation unit 1053 in case that the state where the discharging current Id exceeds the threshold current Ith continues for a predetermined period, and thus it is possible to prevent an instantaneous increase in discharging current caused by noise or the like from being erroneously detected. Further, an amplification unit (differential amplifier circuit 1053) is provided at the preceding stage of the comparator circuit 1052, and thus it is possible to reduce the resistance value of the sense resistor Rs, and to reduce a loss generated in the sense resistor Rs.

Figure 4:
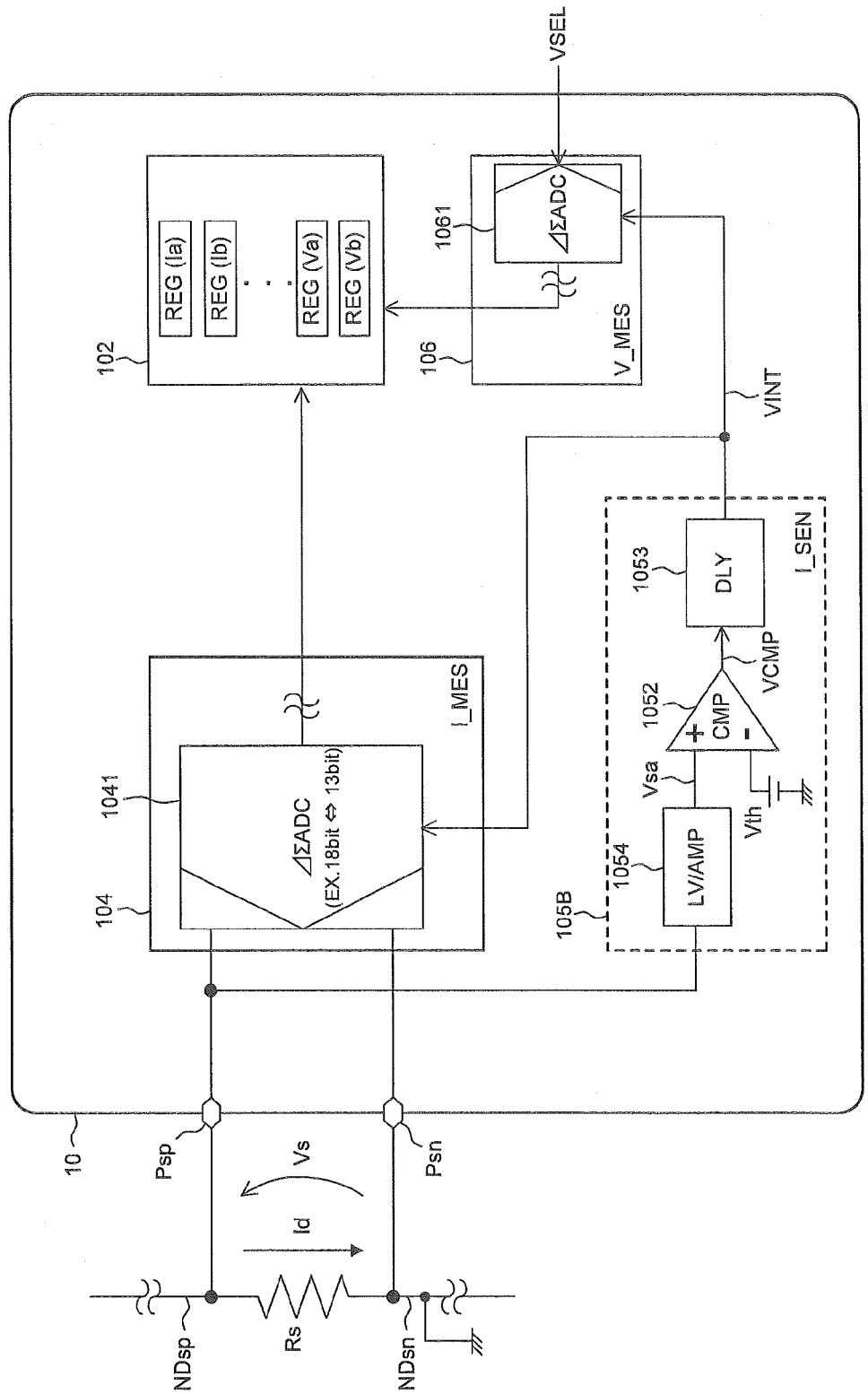
FIG. 4 is a diagram illustrating another internal configuration example of the current detection unit.

Meanwhile, in case that one end of the sense resistor Rs is connected to a ground node, a circuit configuration shown in FIG. 4 can also be adopted as the current detection unit 105. As shown in this drawing, in case that the node NDsn to which one end of the sense resistor Rs is connected is connected to the ground node, the voltage of the node NDsp to which the other end of the sense resistor Rs is connected is input to the comparator circuit 1052 through the amplification unit (level shifter and gain adjustment circuit (LV/AMP)) 1054. According to this, the same effect as that in the configuration of FIG. 3 described above is obtained.

As described above, the interrupt signal VINT generated by the current detection unit 105 is input to the voltage measurement unit 106 and the current measurement unit 104. Hereinafter, operations of the voltage measurement unit 106 and the current measurement unit 104 will be described in detail.

During the normal time (during the normal clock operation mode of the CPU 22), the voltage measurement unit 106 periodically executes the measurement of the output voltage of each of the single battery cells Cell1 to CellM and the calculation of the output voltage Vbat of the assembled battery 11. In addition, the voltage measurement unit 106 performs a measurement operation using the interrupt signal VINT as a trigger, in addition to the periodical measurement operation. For example, in case that the interrupt signal VINT is output, the voltage measurement unit 106 executes the measurement of the output voltage of each of the single battery cells Cell1 to CellM and the calculation process of the output voltage Vbat of the assembled battery 11, and stores the measurement result of the output voltage Vbat in that case in the register unit 102. Meanwhile, as described above, in case that a period in which the CPU 22 operates in the high-speed clock operation mode is 10 ms which is short and thus the measurement of the output voltages of all the single battery cells Cell1 to CellM cannot be completed in the period, the output voltage Vbat of the assembled battery 11 is measured by the following method. For example, the single battery cell having a smallest output voltage during the normal clock operation mode before the interrupt signal VINT is output is selected by the selection unit 107, and only the output voltage of the selected single battery cell is measured by the voltage measurement unit 106. A value which is set to be M times (times the number of single battery cells connected in series to each other) the measurement value is set to be a voltage measurement value Vb during the high-speed clock operation mode. Thereby, it is possible to measure the output voltage Vbat of the assembled battery 11 in the short period of the high-speed clock operation mode.

During the normal time, the current measurement unit 104 periodically executes the measurement of the charging and discharging current. In addition, the current measurement unit 104 performs a measurement operation using the interrupt signal VINT as a trigger, in addition to the periodical measurement operation. Specifically, in case that the interrupt signal VINT is output, the current measurement unit 104 once stops the measurement operation having been periodically performed during the normal time, and executes new current measurement by decreasing the resolution of A/D conversion. For example, when the interrupt signal VINT is output in case that the current measurement unit 104 performs the current measurement with the resolution of A/D conversion of 18 bits, the current measurement unit 104 changes the resolution of A/D conversion to, for example, 13 bits and performs the current measurement. According to this, in case that the current measurement time during, for example, the normal time is assumed to be 250 ms, the current measurement time after the interrupt signal VINT is output is set to be appropriately 8 ms (about one-thirtieth that during the normal time), and the current measurement time is shortened. That is, according to the current measurement unit 104, it is possible to complete the current measurement within the period in which the CPU 22 operates in the high-speed clock operation mode. As described above, since the period in which the CPU operates in the high-speed clock operation mode is approximately 10 ms which is short, there is a concern that similarly to the normal clock operation mode, the performing of high-resolution A/D conversion may cause the current measurement not to be able to be completed within the period of the high-speed clock operation mode. In addition, in case that a low-resolution A/D converter is separately provided in order to measure the discharging current during the high-speed clock operation mode, the scale of the circuit of the battery control IC 10 increases. Consequently, the resolution of A/D conversion is reduced during the high-speed clock operation mode as in the current measurement unit 104, and thus it is possible to complete the current measurement within the period of the high-speed clock operation mode, without separately providing a low-resolution $\Delta\Sigma$ A/D conversion circuit.

Next, a method calculating the amount of maximum power Pmax in the battery control IC 10 will be described in detail.

As described above, the amount of maximum power Pmax is the amount of maximum power which is capable of being supplied from the assembled battery 11 to the internal circuit 20, and is calculated by the product of a maximum current capable of being supplied from the assembled battery 11 in a range in which the power supply voltage of the internal circuit 20 does not fall below a minimum operating voltage, and the above minimum operating voltage. Hereinafter, the detailed description thereof will be given.

Figure 5:
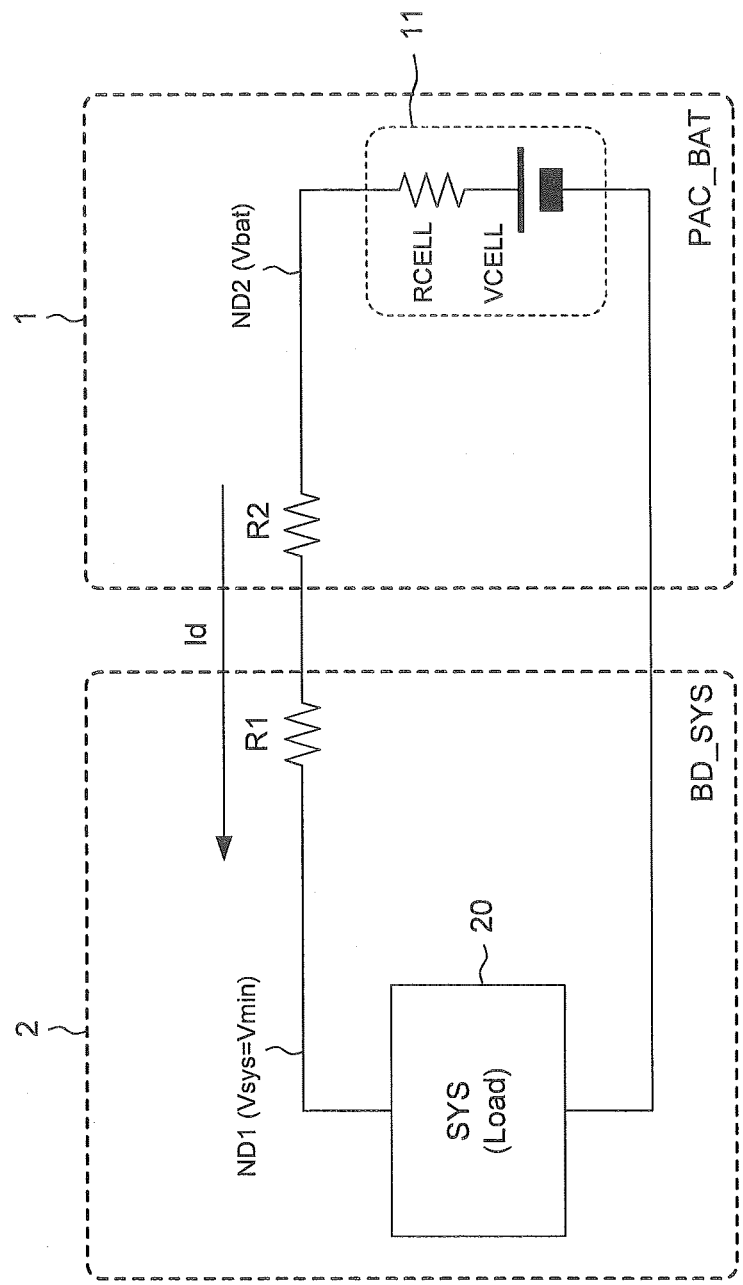
FIG. 5 is a diagram illustrating a method of calculating the amount of maximum power Pmax.

FIG. 5 is a diagram illustrating a method of calculating the amount of maximum power Pmax. In this drawing, a power supply path from the assembled battery 11 to the internal circuit 20 is shown in a simplified manner. In addition, in this drawing, the single battery cells Cell1 to CellM, connected in series to each other, which constitute the assembled battery 11 are shown in a state where the cells are regarded as one single battery cell, the total of cell voltages of the single battery cells Cell1 to CellM is denoted by VCELL, and the total of internal resistances of the single battery cells Cell1 to CellM is denoted by RCELL. In addition, in this drawing, Id indicates the discharging current of the assembled battery 11. Further, in this drawing, the parasitic resistor Rsys constituted by a wiring resistor, a contact resistor of an external terminal, or the like is assumed to be included in a resistor R1 provided in a current path on the system board 2 side, and not only the parasitic resistor Rbat constituted by a wiring resistor, contact resistor of an external terminal, or the like but also the on-resistor of the discharge control transistor is assumed to be included in a resistor R2 provided in a current path on the battery pack 1 side. Meanwhile, in this drawing, a voltage drop due to the body diode DMC of the charge control transistor MNC is ignored.

As shown in FIG. 5, in case that power is supplied from the assembled battery 11 to the internal circuit 20, the discharging current Id flows from the positive electrode (node ND2) of the assembled battery 11 toward the power supply terminal (node ND1) on the high-potential side of the internal circuit 20. In this case, a power supply voltage Vsys (voltage of the node ND1) which is applied to the internal circuit 20 can be represented by (Expression 1).

$$Vsys = VCELL - I(R1 + R2 + RCELL) \quad \text{(Expression 1)}$$

Further, the power supply voltage Vsys of the internal circuit 20 does not fall below the minimum operating voltage Vmin for guaranteeing the operation of the internal circuit 20, and thus (Expression 2) is established.

$$Vmi \le Vsys \quad \text{(Expression 2)}$$
$$Id \le \frac{VCELL - Vmin}{R1 + R2 + RCELL}$$

From (Expression 2), the maximum current Imax which is capable of being supplied from the assembled battery 11 in a range in which the power supply voltage of the internal circuit 20 does not fall below the minimum operating voltage Vmin can be represented by (Expression 3).

$$Imax = \frac{VCELL - Vmin}{R1 + R2 + RCELL} \quad \text{(Expression 3)}$$

In addition, the total cell voltage VCELL is represented by (Expression 4). Here, Va is the output voltage (voltage of the node ND2) of the assembled battery 11 in case that the CPU 22 operates in the normal clock operation mode, and Ia is the discharging current in case that the CPU 22 operates in the normal clock operation mode.

$$VCELL = Va - RCELL \times Ia \quad \text{(Expression 4)}$$

The maximum current Imax can be represented by (Expression 5) by substituting (Expression 4) into (Expression 3).

$$Imax = \frac{(Va - RCELL \times Ia) - Vmin}{R1 + R2 + RCELL} \quad \text{(Expression 5)}$$

Therefore, the amount of maximum power Pmax which is capable of being supplied from the assembled battery 11 to the internal circuit 20 during the high-speed clock operation mode can be represented by (Expression 6).

$$Pmax = \quad \text{(Expression 6)}$$
$$Vmin \times Imax = Vmin \times \frac{(Va - RCELL \times Ia) - Vmin}{R1 + R2 + RCELL}$$

Here, when the output voltage of the assembled battery 11 in case that the CPU 22 operates in the high-speed clock operation mode is set to Vb, and the discharging current in case that the CPU 22 operates in the high-speed clock operation mode is set to Ib, the internal resistance RCELL can be represented by (Expression 7).

$$RCELL = \frac{|Va - Vb|}{|Ia - Ib|} \quad \text{(Expression 7)}$$

As understood from (Expression 7), in case that the output voltage Va and the discharging current Ia of the assembled battery 11 during the normal clock operation mode, and the output voltage Vb and the discharging current Ib of the assembled battery 11 during the high-speed clock operation mode are measured, it is possible to estimate the total internal resistance RCELL of the assembled battery 11. The maximum power Pmax can be calculated by substituting this estimated total internal resistance RCELL into (Expression 6).

Next, a process flow of calculating the amount of maximum power Pmax in the battery control IC 10 will be described.

Figure 6:
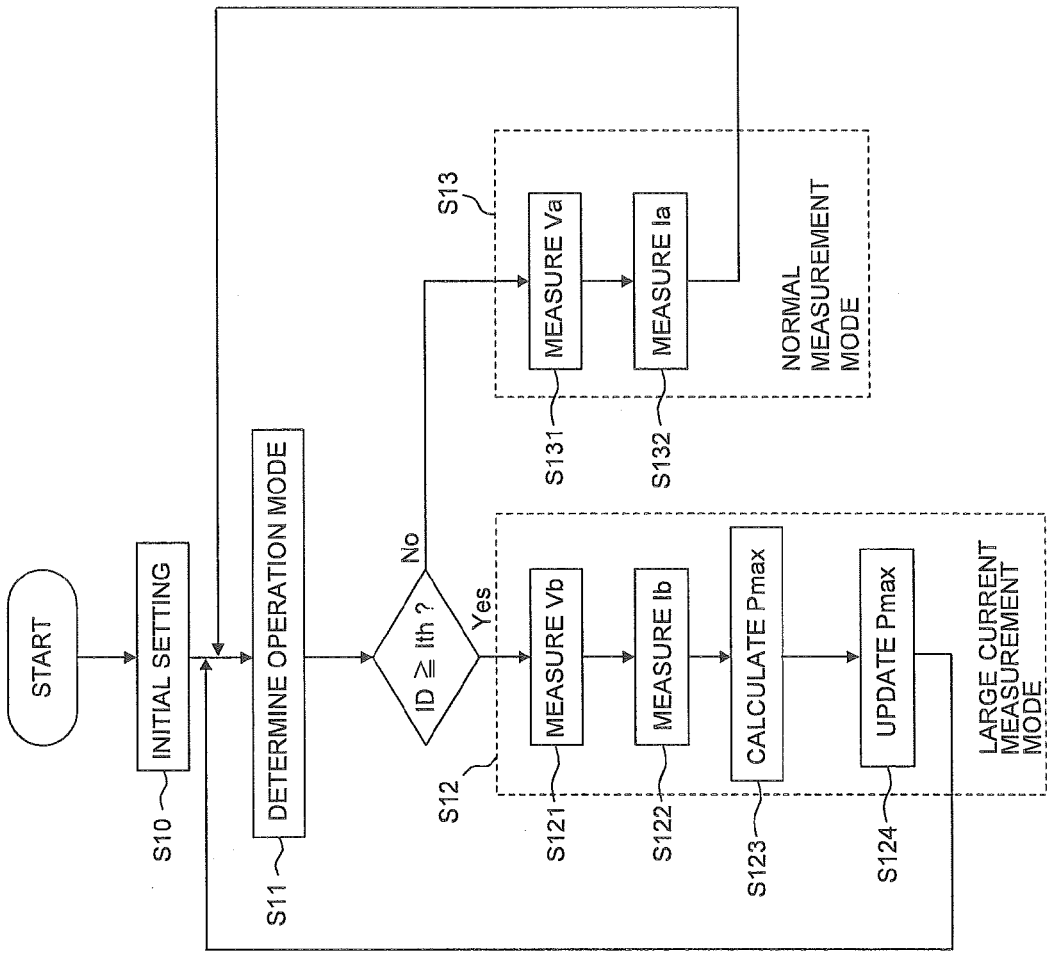
FIG. 6 is a diagram illustrating a process flow of the battery control IC according to the first embodiment.

FIG. 6 is a diagram illustrating a process flow relating to the calculation of the amount of maximum power Pmax in the battery control IC according to the first embodiment.

For example, in case that the power-on reset of the battery control IC 10 is released, a process relating to the calculation of the amount of maximum power Pmax is started. First, the initial setting of the battery control IC 10 is performed (S10) Specifically, in the initial setting, parameters such as the resistance value of the sense resistor Rs, the resistance values of the parasitic resistors Rsys and Rbat, the on-resistances of the charge control/discharge control transistors MNC and MND, the forward voltage of the body diodes DMC and DMD, and the minimum guarantee voltage Vmin are set in the register unit 102. These parameters are supplied from, for example, the internal circuit 20 on the system board 2. Thereafter, the current measurement unit 104, the voltage measurement unit 106, and the like are set to be in an enabled state, the measurement of the charging and discharging currents and the battery voltage is started, and the state monitoring of the assembled battery 11 is started.

In case that the state monitoring of the assembled battery 11 is started, the operation mode of the CPU of the internal circuit 20 is first determined (S11). Specifically, the operation mode of the CPU of the internal circuit 20 is determined depending on whether the discharging current Id exceeds the threshold current Ith. For example, in case that the discharging current Id does not exceed the threshold current Ith, and that the interrupt signal VINT is not output from the current detection unit 105, the battery control IC 10 operates in the normal measurement mode (S13). Specifically, the voltage measurement unit 106 periodically executes the measurement of the output voltage Vbat of the assembled battery 11 using the aforementioned method (S131) A result of measurement performed by the voltage measurement unit 106 in this case is stored in the register unit 102 as the voltage measurement value Va during the normal clock operation mode. Similarly, the current measurement unit 104 measures the discharging current Id through the high-resolution A/D conversion described above (S132). A result of measurement performed by the current measurement unit 104 in this case is stored in the register unit 102 as the current measurement value Ia during the normal clock operation mode. The measurement of the output voltage Vbat and the discharging current Id in the normal measurement mode is repeatedly executed until the discharging current Id exceeds the threshold current Ith.

In case that the discharging current Id exceeds the threshold current Ith, and that the interrupt signal VINT is output from the current detection unit 105, the battery control IC 10 operates in a large current measurement mode (S12). Specifically, the voltage measurement unit 106 stops the measurement of the output voltage Vbat in the normal measurement mode, and measures the output voltage Vbat using the aforementioned method (S121). A result of measurement performed by the voltage measurement unit 106 in this case is stored in the register unit 102 as the voltage measurement value Vb during the high-speed clock operation mode. Similarly, the current measurement unit 104 stops the measurement of the discharging current Id in the normal measurement mode, and performs the current measurement through the low-resolution A/D conversion described above (S122). A result of measurement performed by the current measurement unit 104 in this case is stored in the register unit 102 as the current measurement value Ib during the high-speed clock operation mode.

Thereafter, in case that interrupt signals INTV/INTI indicating measurement completion are output from the voltage measurement unit 106 and the current measurement unit 104, the arithmetic operation unit 101 starts to calculate the amount of maximum power Pmax (S123). Specifically, the arithmetic operation unit 101 performs an arithmetic operation in accordance with (Expression 7) described above using the current measurement values Ia and Ib and the voltage measurement values Va and Vb which are stored in the register unit 102, and calculates the internal resistance of the assembled battery 11. The arithmetic operation unit 101 performs an arithmetic operation in accordance with (Expression 6) described above using the calculated internal resistance value and other parameters (such as minimum guarantee voltage Vmin, parasitic resistors Rsys and Rbat, on-resistance of the discharge control transistor) which are stored in the register unit 102, and thus calculates the amount of maximum power Pmax. The value of the amount of maximum power Pmax calculated is set in the register unit 102, and the value of the amount of maximum power Pmax is updated (S124). Thereafter, the flow returns to the determination process of the operation mode in step S11, and the above processes are repeatedly executed (S11 to S13).

Figure 7:
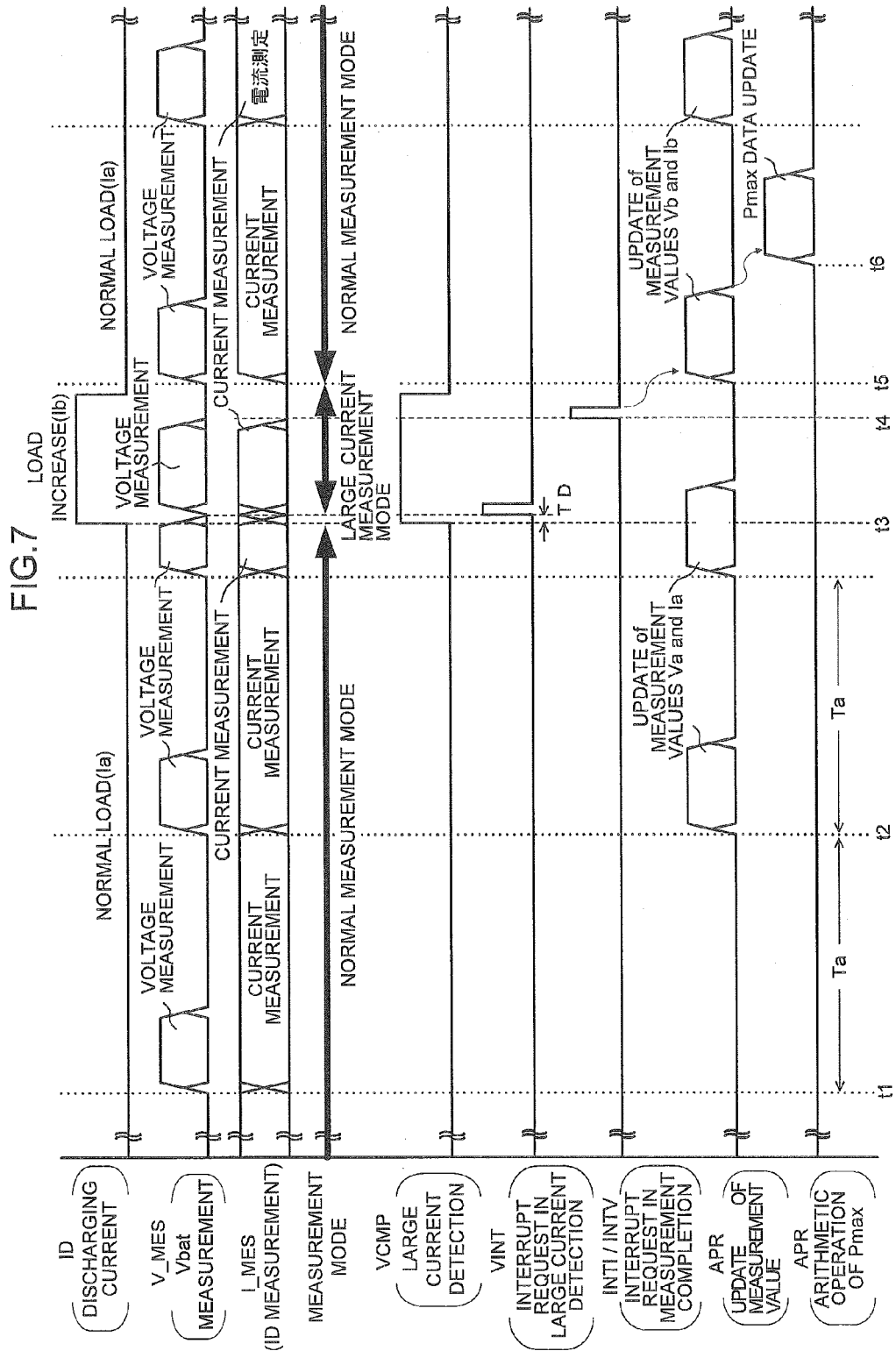
FIG. 7 is a timing chart relating to the calculation of the amount of maximum power Pmax performed by the battery control IC according to the first embodiment.

FIG. 7 is a timing chart relating to the calculation of the amount of maximum power Pmax in the battery control IC 10. As shown in this drawing, in case that the CPU of the internal circuit 20 operates in the normal clock operation mode, the voltage measurement unit 106 and the current measurement unit 104 operate in the normal measurement mode, the output voltage Vbat and the discharging current Id of the assembled battery 11 are measured for each predetermined conversion cycle, and the voltage measurement value Va and the current measurement value Ia of the register unit 102 are updated for each period Ta. For example, as shown in FIG. 7, the voltage measurement unit 106 and the current measurement unit 104 start the measurement operations at time t1, and the voltage measurement value Va and the current measurement value Ia of the register unit 102 are updated at timing t2 in which the measurement performed by the current measurement unit 104 is completed. Here, in case that the measurement time in the voltage measurement unit 106 is set to, for example, appropriately 8 ms, and that the measurement time in the current measurement unit 104 is set to, for example, appropriately 250 ms, the voltage measurement value Va and the current measurement value Ia of the register unit 102 are updated for every about 250 ms.

Thereafter, for example, at time t3, in case that it is detected that the CPU of the internal circuit 20 transitions from the normal clock operation mode to the high-speed clock operation mode, and that the interrupt signal VINT is output, the voltage measurement unit 106 and the current measurement unit 104 transition from the normal measurement mode to the large current measurement mode, and start to measure the voltage measurement value Vb and the current measurement value Ib during the high-speed clock operation mode. At time t4 after the completion of measurement, the voltage measurement unit 106 and the current measurement unit 104 output the interrupt signals INTV and INTI, respectively, and update the voltage measurement value Vb and the current measurement value Ib of the register unit 102. Thereafter, at time t5, the voltage measurement unit 106 and the current measurement unit 104 return from the large current measurement mode to the normal clock operation mode. In this case, the resolution of the A/D converter 1041 of the current measurement unit 104 is set to be high (for example, the resolution returns from 13 bits to 18 bits).

At time t6, the arithmetic operation unit 101 having received the interrupt signals INTV and INTI calculates the amount of maximum power Pmax using the voltage measurement value Vb and the current measurement value Ib which are updated. The arithmetic operation unit 101 then stores the calculated amount of maximum power Pmax in the register unit 102. Information of the amount of maximum power Pmax stored in the register unit 102 is transmitted to the internal circuit 20 at a predetermined timing (for example, every second). The internal circuit 20 then determines the clock frequency f2 of the CPU 22 during the high-speed clock operation mode and the period of the high-speed clock operation mode, on the basis of the received information of the amount of maximum power Pmax.

As described above, according to the battery control IC 10 of the first embodiment, the transition of the CPU of the internal circuit 20 to the high-speed clock operation mode can be easily detected by monitoring the discharging current of the assembled battery 11. Therefore, it is possible to easily measure the output voltage (Vb) and the discharging current (Ib) of the assembled battery 11 during the high-speed clock operation mode, and to estimate the internal resistance of the assembled battery 11 during the generation of a large current with a high degree of accuracy. Thereby, it is possible to calculate a more accurate amount of maximum power Pmax, and thus it is possible to improve the arithmetic operation performance of the CPU 22 in the internal circuit 20.

Second Embodiment

Figure 8:
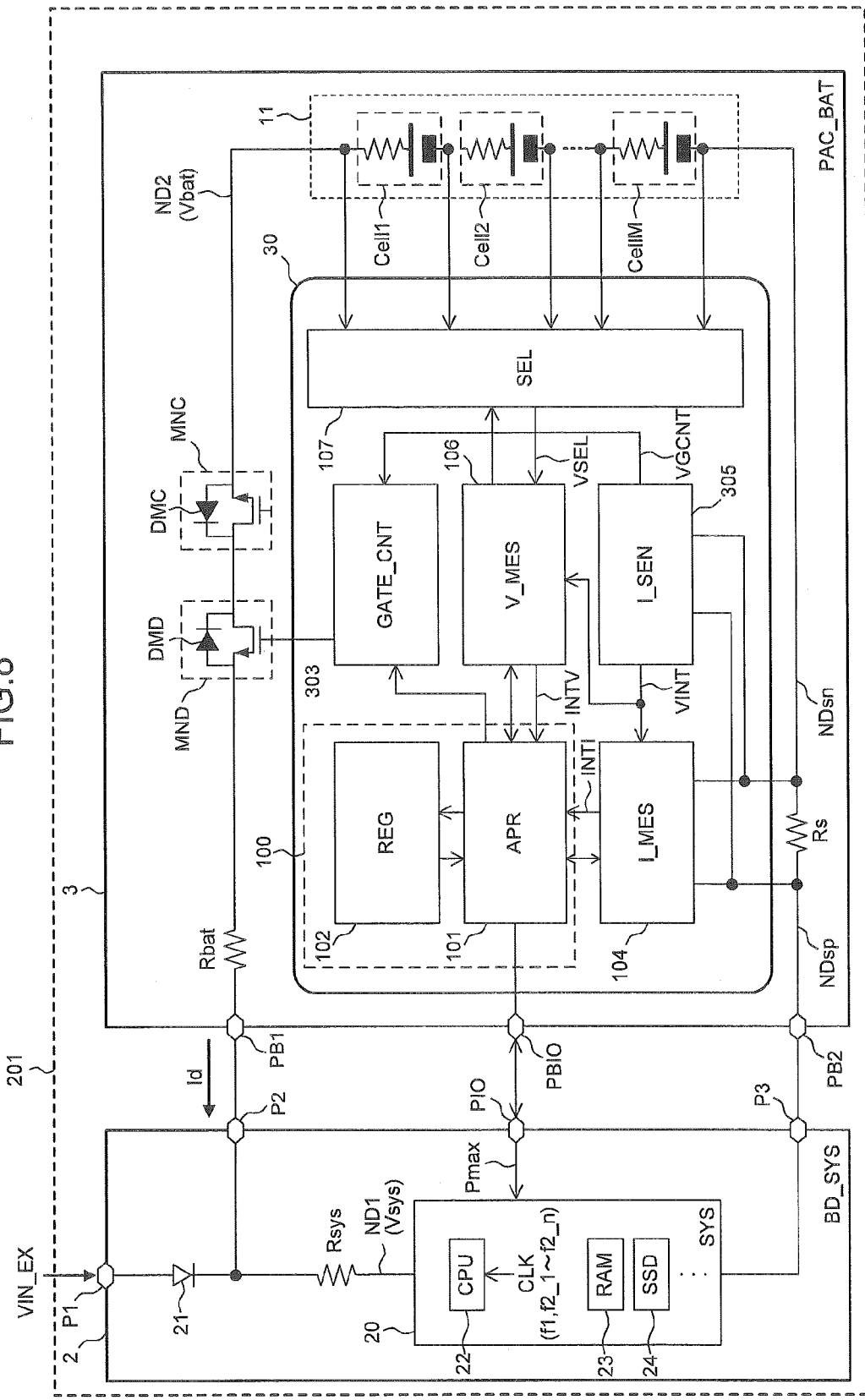
FIG. 8 is a diagram illustrating a personal data assistant on which a battery pack including a battery control IC according to a second embodiment is mounted.

FIG. 8 is a diagram illustrating a personal data assistant on which a battery pack including a battery control IC according to a second embodiment is mounted.

A battery control IC 30 mounted on a battery pack 3 of a personal data assistant 201 shown in this drawing has a function of turning on the charge control transistor during the high-speed clock operation mode of the CPU 22 of the internal circuit 20, in addition to the function of the battery control IC 10 according to the first embodiment. Hereinafter, the battery control IC 30 will be described in detail.

The battery control IC 30 includes a current detection unit 305 and a gate control unit 303 in place of the current detection unit 105 and the gate control unit 103. The other components are the same as those of the battery control IC 10 according to the first embodiment. The same components are denoted by the same reference numerals and signs, and thus the detailed description thereof will not be given.

Figure 9:
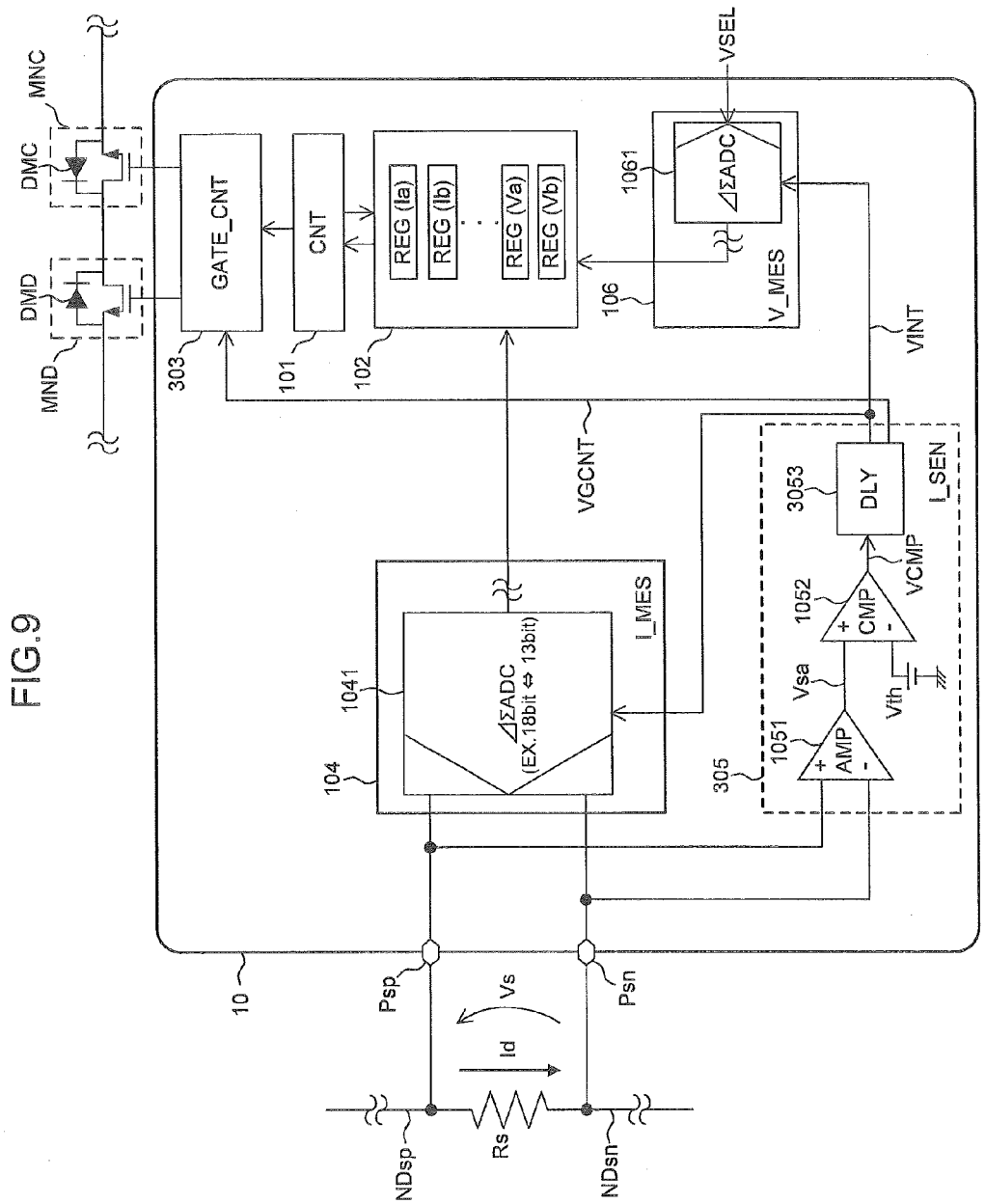
FIG. 9 is a diagram illustrating an internal configuration example of a current detection unit according to the second embodiment.

FIG. 9 shows an internal configuration example of the current detection unit 305. As shown in this drawing, an output signal generation unit 3053 in the current detection unit 305 generates the interrupt signal VINT on the basis of the comparison result VCMP of the comparator circuit 1052, similarly to the output signal generation unit 1053. Further, the output signal generation unit 3053 generates a control signal VGCNT on the basis of the comparison result VCMP. For example, in case that the state in which the discharging current Id exceeds the threshold current Ith continues for the predetermined period TD, the output signal generation unit 3053 asserts the control signal VGCNT (for example, sets the control signal to be at a high level). In case that the discharging current Id falls below the threshold current Ith, the control signal VGCNT is negated (for example, set to be at a low level).

The gate control unit 303 controls the charge control/discharge control transistors MND and MNC in accordance with an instruction from the data processing control unit 100 and the control signal VGCNT. For example, the gate control unit 303 turns on the discharge control transistor MND in case that an instruction of discharge execution from the data processing control unit 100 is given, and the gate control unit 303 turns on the charge control transistor MNC in case that an instruction of charge execution therefrom is given. Further, when the control signal VGCNT is asserted in case that an instruction of discharge execution from the data processing control unit 100 is given, the gate control unit 303 also turns on the charge control transistor MNC in addition to the discharge control transistor MND. Thereby, since a current path going through between the source and drain of the charge control transistor MNC is formed in addition to the current path through the body diode DMC of the charge control transistor MNC, it is possible to further reduce a voltage drop in the power supply path between the assembled battery 11 and the internal circuit 20 in case that a large discharging current is generated.

FIG. 10 is a timing chart illustrating an operation example of the battery control IC 30. In the timing chart shown in this drawing, timings of the turn-on and turn-off of the discharge control transistor MND and the charge control transistor MNC are further added to the timing chart relating to the generation of the amount of maximum power Pmax shown in FIG. 7 described above.

As shown in this drawing, at time t3, in case that a shift of the CPU 22 of the internal circuit 20 to the high-speed clock operation mode is detected, the current detection unit 305 sets the control signal VGCNT to be at a high level, and turns on the charge control transistor MNC. At time t5 after that, in case that a shift of the CPU 22 from the high-speed clock operation mode to the normal clock operation mode is detected, the current detection unit 305 sets the control signal VGCNT to be at a low level, and turns off the charge control transistor MNC. The other controls are the same as those in the battery control IC 10 according to the first embodiment.

As described above, according to the battery control IC 30 of the second embodiment, it is possible to calculate the amount of maximum power Pmax with a high degree of accuracy, similarly to the battery control IC 10. Further, according to the battery control IC 30, not only the discharge control transistor but also the charge control transistor are turned on during the high-speed clock operation mode of the CPU 22 in which the discharging current becomes larger, and it is possible to reduce a voltage drop in the power supply path between the assembled battery 11 and the internal circuit 20, and to increase the amount of power supplied during discharge. According to this, since the maximum current Imax which is capable of being output from the assembled battery 11 becomes much larger during the high-speed clock operation mode, it is possible to further increase the amount of maximum power Pmax, and to contribute to a further improvement in the arithmetic operation performance of the CPU 22 in the internal circuit 20.

As stated above, while the invention devised by the inventor has been described specifically based on the embodiments thereof, the present invention is not limited to the embodiments, and it goes without saying that various changes and modifications may be made without departing from the scope of the invention.

For example, in the above description, a case where the battery control ICs according to the first and second embodiments are applied to a battery pack of a notebook computer has been illustrated, but the battery control ICs can be similarly applied to a battery pack, such as a tablet terminal or a smartphone, on which a CPU having a frequency variable function is mounted.

In addition, the magnitude of the threshold current Ith may be changed in accordance with the discharge rate of the assembled battery 11. For example, the threshold current Ith (threshold voltage Vth) is set to be low in case that the discharge rate is 1 C, and the threshold current Ith is set to be high in case that the discharge rate is 4 C. According to this, it is possible to further improve the detection accuracy of the high-speed clock operation mode.

In addition, the battery controls ICs according to the first and second embodiments are not limited to a one-chip microcontroller, and may be a multi-chip microcontroller.

What is claimed is:
1. A semiconductor device for monitoring a state of a battery, the semiconductor device comprising:
 a voltage measurement unit that measures a voltage of the battery;
 a current measurement unit that measures a charging current and a discharging current of the battery;
 a data processing control unit that generates state information indicating the state of the battery, on a basis of measurement results of the voltage measurement unit and the current measurement unit; and a current detection unit that detects that the discharging current exceeds a predetermined threshold, wherein an output signal from the current detection unit is configured to be input to the voltage measurement unit such that, based on the output signal, the voltage measurement unit and the current measurement unit are able to measure the voltage and the discharging current in a case that the current detection unit detects that the discharging current exceeds the predetermined threshold, and wherein the data processing control unit estimates an internal resistance of the battery on a basis of a voltage measurement value measured by the voltage measurement unit in accordance with the detection performed by the current detection unit and a current measurement value measured by the current measurement unit in accordance with the detection performed by the current detection unit, and calculates an amount of maximum power which is capable of being supplied from the battery on a basis of the estimated value.

2. The semiconductor device according to claim 1, wherein the current measurement unit includes a delta sigma-type A/D conversion circuit, and wherein a resolution of the A/D conversion circuit becomes lower in accordance with the detection performed by the current detection unit.

3. The semiconductor device according to claim 2, further comprising a control unit that controls a charge control transistor and a discharge control transistor which are connected in series to a supply path of power between the battery and an external device, and wherein the control unit enables the battery to be charged by turning on the charge control transistor, enables the battery to be discharged by turning on the discharge control transistor, and further turns on the charge control transistor in a state where the discharge control transistor is turned on in a case that the current detection unit detects that the discharging current exceeds the predetermined threshold during discharge of the battery.

4. The semiconductor device according to claim 2, wherein the current detection unit includes a comparator circuit that compares a detection voltage based on the discharging current with a reference voltage based on the predetermined threshold.

5. The semiconductor device according to claim 4, wherein the current detection unit further includes a signal generation circuit that outputs the output signal including an interrupt signal for instructing measurement execution in a case that a state where the detection voltage exceeds the reference voltage continues for a predetermined period, and wherein the voltage measurement unit and the current measurement unit start measurement in accordance with the interrupt signal.

6. The semiconductor device according to claim 5, wherein the current detection unit further includes an amplification unit that amplifies a signal level of the detection voltage and supplies the amplified signal level to the comparator circuit.

7. The semiconductor device according to claim 1, wherein the output signal from the current detection unit is directly inputted to the voltage measurement unit.

8. The semiconductor device according to claim 1, wherein the current detection unit further includes a signal generation circuit that outputs the output signal including an interrupt signal for instructing measurement execution in a case that a state where the detection voltage exceeds the reference voltage continues for a predetermined period.

9. The semiconductor device according to claim 8, wherein the voltage measurement unit and the current measurement unit start measurement in accordance with the interrupt signal.

10. The semiconductor device according to claim 1, wherein the current measurement unit includes a conversion circuit, and wherein a resolution of the conversion circuit becomes lower in accordance with the detection performed by the current detection unit.

11. The semiconductor device according to claim 1, wherein the current measurement unit includes a conversion circuit, and wherein a resolution of the conversion circuit changes in accordance with the detection performed by the current detection unit.

12. A battery pack, comprising:

an assembled battery which includes a plurality of secondary batteries;

a first terminal and a second terminal for connecting the assembled battery to an external device;

a charge control transistor and a discharge control transistor which are connected in series to a power supply path between the first terminal and the assembled battery;

a sense resistor which is connected in series to a power supply path between the second terminal and the assembled battery; and a battery control IC that monitors a state of the assembled battery and controls turn-on and turn-off of the charge control transistor and the discharge control transistor, wherein the battery control IC includes:

a voltage measurement unit that measures an output voltage of the assembled battery;

a current measurement unit that measures a discharging current and a charging current of the assembled battery on a basis of a voltage between both ends of the sense resistor;

a data processing control unit that generates state information indicating a state of a battery, on a basis of measurement results of the voltage measurement unit and the current measurement unit;

a current detection unit that detects that a voltage between both ends of the sense resistor exceeds a predetermined threshold voltage; and a control unit that controls the charge control transistor and the discharge control transistor, wherein an output signal from the current detection unit is configured to be input to the voltage measurement unit such that, based on the output signal, the voltage measurement unit and the current measurement unit are able to measure the output voltage and the discharging current in a case that the current detection unit detects that the discharging current exceeds the predetermined threshold, and wherein the data processing control unit estimates an internal resistance of the battery on a basis of a voltage measurement value measured by the voltage measurement unit in accordance with the detection performed by the current detection unit and a current measurement value measured by the current measurement unit in accordance with the detection performed by the current detection unit, and calculates an amount of maximum power which is capable of being supplied from the assembled battery on a basis of the estimated value.

13. The battery pack according to claim 12, wherein the current measurement unit includes a delta sigma-type A/D conversion circuit, and
wherein a resolution of the A/D conversion circuit becomes lower in accordance with the detection performed by the current detection unit.

14. The battery pack according to claim 13, wherein the control unit enables the battery to be charged by turning on the charge control transistor and turning off the discharge control transistor, enables the battery to be discharged by turning off the charge control transistor and turning on the discharge control transistor, and further turns on the charge control transistor in a state where the discharge control transistor is turned on in a case that the current detection unit detects that the discharging current exceeds the predetermined threshold during discharge of the battery.

15. A personal data assistant, comprising:
the battery pack according to claim 12; and
an internal circuit, including a CPU, which is able to be operated by a supply of power from the assembled battery,
wherein the internal circuit is configured such that a normal clock operation mode in which the CPU operates at a first clock frequency and a high-speed clock operation mode in which the CPU operates at a second clock frequency higher than the first clock frequency are capable of being switched between, and determines a magnitude of the second clock frequency on a basis of an amount of maximum power calculated by the data processing control unit in a case that the CPU operates in the high-speed clock operation mode.

16. The battery pack according to claim 12, wherein the current measurement unit includes a conversion circuit, and
wherein a resolution of the conversion circuit becomes lower in accordance with the detection performed by the current detection unit.

17. The battery pack according to claim 12, wherein the current measurement unit includes a conversion circuit, and
wherein a resolution of the conversion circuit changes in accordance with the detection performed by the current detection unit.

18. A semiconductor device for monitoring a state of a battery, the semiconductor device comprising:
a voltage measurement unit that measures an output voltage of the battery;
a current measurement unit that measures a charging current and a discharging current of the battery;
a data processing control unit that generates state information indicating a state of the battery, on a basis of measurement results of the voltage measurement unit and the current measurement unit; and
a current detection unit that detects that the discharging current exceeds a predetermined threshold, an output signal from the current detection unit is configured to be input to the voltage measurement unit,
wherein the voltage measurement unit and the current measurement unit have a first measurement mode and a second measurement mode,
wherein the voltage measurement unit measures the output voltage in the second measurement mode in a case that the current detection unit detects that the discharging current exceeds the predetermined threshold at a time of measuring the output voltage in the first measurement mode,
wherein the current measurement unit measures the discharging current in the second measurement mode in a case that the current detection unit detects that the discharging current exceeds the predetermined threshold at a time of measuring the discharging current in the first measurement mode, and
wherein the data processing control unit estimates an internal resistance of the battery on a basis of a first voltage measurement value and a first current measurement value which are measured by the voltage measurement unit and the current measurement unit in the first measurement mode and a second voltage measurement value and a second current measurement value which are measured by the voltage measurement unit and the current measurement unit in the second measurement mode, and calculates an amount of maximum power which is capable of being supplied from the battery on a basis of the estimated value.

19. The semiconductor device according to claim 18, wherein the current measurement unit includes a delta sigma-type A/D conversion circuit, and
wherein the A/D conversion circuit is configured such that a resolution of A/D conversion in the second measurement mode becomes lower than a resolution of A/D conversion in the first measurement mode.

20. The semiconductor device according to claim 19, further comprising a control unit that controls a charge control transistor and a discharge control transistor which are connected in series to a supply path of power between the battery and an external device, and
wherein the control unit enables the battery to be charged by turning on the charge control transistor, enables the battery to be discharged by turning on the discharge control transistor, and further turns on the charge control transistor in a state where the discharge control transistor is turned on in a case that the current detection unit detects that the discharging current exceeds the predetermined threshold during discharge of the battery.

* * * * *